(12) United States Patent
Lee et al.

(10) Patent No.: US 11,398,511 B2
(45) Date of Patent: Jul. 26, 2022

(54) METHOD FOR FABRICATING TFT ARRAY SUBSTRATE

(71) Applicant: Samsung Display Co., Ltd., Yongin-si (KR)

(72) Inventors: Hong Beom Lee, Hwaseong-si (KR); Chang Woo Kwon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 16/933,801

(22) Filed: Jul. 20, 2020

(65) Prior Publication Data

US 2021/0183913 A1    Jun. 17, 2021

(30) Foreign Application Priority Data

Dec. 11, 2019  (KR) .................. 10-2019-0164914

(51) Int. Cl.
*H01L 27/12*      (2006.01)
*H01L 21/3213*   (2006.01)
*H01L 21/321*    (2006.01)

(52) U.S. Cl.
CPC ...... *H01L 27/1288* (2013.01); *H01L 21/3212* (2013.01); *H01L 21/32139* (2013.01); *H01L 27/127* (2013.01)

(58) Field of Classification Search
CPC ............. H01L 27/1288; H01L 21/3212; H01L 21/32139; H01L 27/127; H01L 27/124; H01L 27/1259; H01L 27/1214; H01L 27/1262; H01L 27/3262; H01L 29/786; G02F 1/1362; G02F 1/1368
USPC ........................................................ 438/158
See application file for complete search history.

(56) References Cited

U.S. PATENT DOCUMENTS

2009/0032819 A1* 2/2009 Lim .................... G02F 1/13458
                                                                         438/34
2019/0196259 A1    6/2019 Lee et al.

FOREIGN PATENT DOCUMENTS

| CN | 109712931 | 5/2019 |
|---|---|---|
| KR | 10-2013-0077439 | 7/2013 |
| KR | 10-1844953 | 4/2018 |

* cited by examiner

*Primary Examiner* — Tong-Ho Kim
(74) *Attorney, Agent, or Firm* — H.C. Park & Associates, PLC

(57) ABSTRACT

A method of fabricating a thin-film transistor (TFT) array substrate including forming a gate electrode on a substrate, forming a gate insulating layer on the gate electrode, forming a semiconductor layer on the gate insulating layer, forming an ohmic contact layer on the semiconductor layer, and forming a source electrode and a drain electrode comprising a plurality of metal layer patterns on the ohmic contact layer, in which the semiconductor layer, the ohmic contact layer, the source electrode and the drain electrode are formed through a single mask process, and one of the plurality of metal layer patterns is etched through a polishing process to form the source electrode and the drain electrode.

20 Claims, 31 Drawing Sheets

METHOD FOR FABRICATING TFT ARRAY SUBSTRATE

CROSS-REFERENCE TO RELATED APPLICATIONS

This application claims the benefit of Korean Patent Application No. 10-2019-0164914, filed on Dec. 11, 2019, which is hereby incorporated by reference for all purposes as if fully set forth herein.

BACKGROUND

Field

Exemplary embodiments of the invention relate generally to a method of fabricating a thin-film transistor (TFT) array substrate.

Discussion of the Background

Display devices are becoming more and more important as multimedia technology evolves. Accordingly, a variety of types of display devices, such as liquid-crystal display (LCD) devices and organic light-emitting display (OLED) devices, are currently being used.

An LCD device is one of the most commonly used flat panel display devices. An LCD device includes two substrates where field generating electrodes, such as pixel electrodes and a common electrode, are formed, and a liquid-crystal layer disposed therebetween. An LCD device displays an image by applying voltage to field generating electrodes to generate electric field across a liquid-crystal layer, such that liquid-crystal molecules in the liquid-crystal layer are aligned by the electric field to control polarization of incident light.

Among LCD devices, an active matrix LCD device uses thin-film transistors. More particularly, a thin-film transistor is connected to a pixel electrode, and a pixel is driven by the voltage maintained in a storage capacitor of the thin-film transistor. For thin-film transistors used in active matrix LCD devices, it is important to have good durability for a long lifespan and excellent electrical reliability, in addition to the basic characteristics of thin-film transistors, such as a high carrier mobility and a low leakage current.

The TFT array substrate forming an LCD device may be produced by using a plurality of masks. Since the mask process is relatively expensive, reducing the number of masks used may reduce fabrication costs. However, reducing the number of the masks may change the characteristics of the thin-film transistors. Accordingly, research for fabricating thin-film transistors having excellent characteristics is ongoing.

The above information disclosed in this Background section is only for understanding of the background of the inventive concepts, and, therefore, it may contain information that does not constitute prior art.

SUMMARY

TFT array substrates constructed according to exemplary embodiments of the invention and a method of fabricating the same are capable of reducing the amount of Mura defects caused by differences in capacitance between signal lines and pixel electrodes.

Exemplary embodiments also provide a method of fabricating a TFT array substrate capable of preventing an off-current of a thin-film transistor from increasing.

Additional features of the inventive concepts will be set forth in the description which follows, and in part will be apparent from the description, or may be learned by practice of the inventive concepts.

A method of fabricating a thin-film transistor (TFT) array substrate according to an exemplary embodiment includes the steps of forming a gate electrode on a substrate, forming a gate insulating layer on the gate electrode, forming a semiconductor layer on the gate insulating layer, forming an ohmic contact layer on the semiconductor layer, and forming a source electrode and a drain electrode comprising a plurality of metal layer patterns on the ohmic contact layer, in which the semiconductor layer, the ohmic contact layer, the source electrode, and the drain electrode are formed through a single mask process, and one of the plurality of metal layer patterns is etched through a polishing process to form the source electrode and the drain electrode.

The gate electrode may be formed using a first mask.

Forming the semiconductor layer, the source electrode, and the drain electrode may include stacking a first amorphous silicon layer, a second amorphous silicon layer, a second metal layer, and a third metal layer on the substrate, forming a photoresist pattern on the third metal layer using a second mask, and etching the first amorphous silicon layer, the second amorphous silicon layer, the second metal layer, and the third metal layer to form the semiconductor layer, the ohmic contact layer, the source electrode, and the drain electrode.

The second mask may include a transmissive region through which light is transmitted, a non-transmissive region through which light is blocked, and a transflective region through which an amount of transmitted light is adjusted.

The photoresist pattern may include a first photoresist region in line with the non-transmissive region and a second photoresist region in line with the transflective region.

A thickness of the second photoresist region may be less than a thickness of the first photoresist region.

Forming the source electrode and the drain electrode may include wet etching the second metal layer and the third metal layer by using the photoresist pattern as a mask to form a second metal layer pattern and a third metal layer pattern, ashing the photoresist pattern to remove the second photoresist region and reduce the thickness of the first photoresist region to form a third photoresist region, wet etching the third metal layer pattern not overlapping with the third photoresist region to form a fourth metal layer pattern, and etching the second metal layer pattern not overlapping with the third photoresist region via a polishing process to form a fifth metal layer pattern, such that the source electrode and the drain electrode including the fourth metal layer pattern and the fifth metal layer pattern stacked one over another may be formed.

The method may further include, prior to the ashing the photoresist pattern, simultaneously dry etching the first amorphous silicon layer and the second amorphous silicon layer using the photoresist pattern as a mask to form the first amorphous silicon layer as a semiconductor pattern and the second amorphous silicon layer as an ohmic pattern.

After forming the source electrode and the drain electrode, the ohmic pattern and the semiconductor pattern may be dry etched using the photoresist pattern as a mask to form the ohmic contact layer and the semiconductor layer.

The method may further include, after the forming the source electrode and the drain electrode, forming a passivation layer over the substrate and forming a via hole exposing the drain electrode using a third mask, and forming a pixel electrode on the passivation layer by using a fourth mask.

The polishing process may include applying a polishing slurry onto the substrate and polishing one of the plurality of metal layer patterns using a polishing apparatus including a polishing pad.

The polishing slurry may include polishing particles, and an average particle diameter of the polishing particles may be in a range from 0.1 μm to 5 μm.

An acidity (pH) of the polishing slurry may be in a range from 2 to 8.

The polishing pad may include suede or polyurethane.

The polishing apparatus may apply a polishing pressure to press the substrate, and a polishing pressure may be in a range from 100 Pa to 300 Pa.

A method of fabricating a thin-film transistor (TFT) array substrate according to another exemplary embodiment includes the steps of forming a gate electrode on a substrate, forming a gate insulating layer on the gate electrode, forming a semiconductor layer on the gate insulating layer, forming an ohmic contact layer on the semiconductor layer, and forming a source electrode and a drain electrode on the ohmic contact layer by etching through a polishing process, in which the polishing process includes applying a polishing slurry onto the substrate and etching the source electrode and the drain electrode by using a polishing apparatus including a polishing pad.

The polishing slurry may have a negative zeta potential, and the source and drain electrodes may have a positive zeta potential at a same pH value.

The polishing slurry may include polishing particles, and an average particle diameter of the polishing particles may be in a range from 0.1 μm to 5 μm.

An acidity (pH) of the polishing slurry may be in a range from 2 to 8.

The polishing apparatus may apply a polishing pressure to press the substrate, and a polishing pressure ranges from 100 to 300 Pa.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
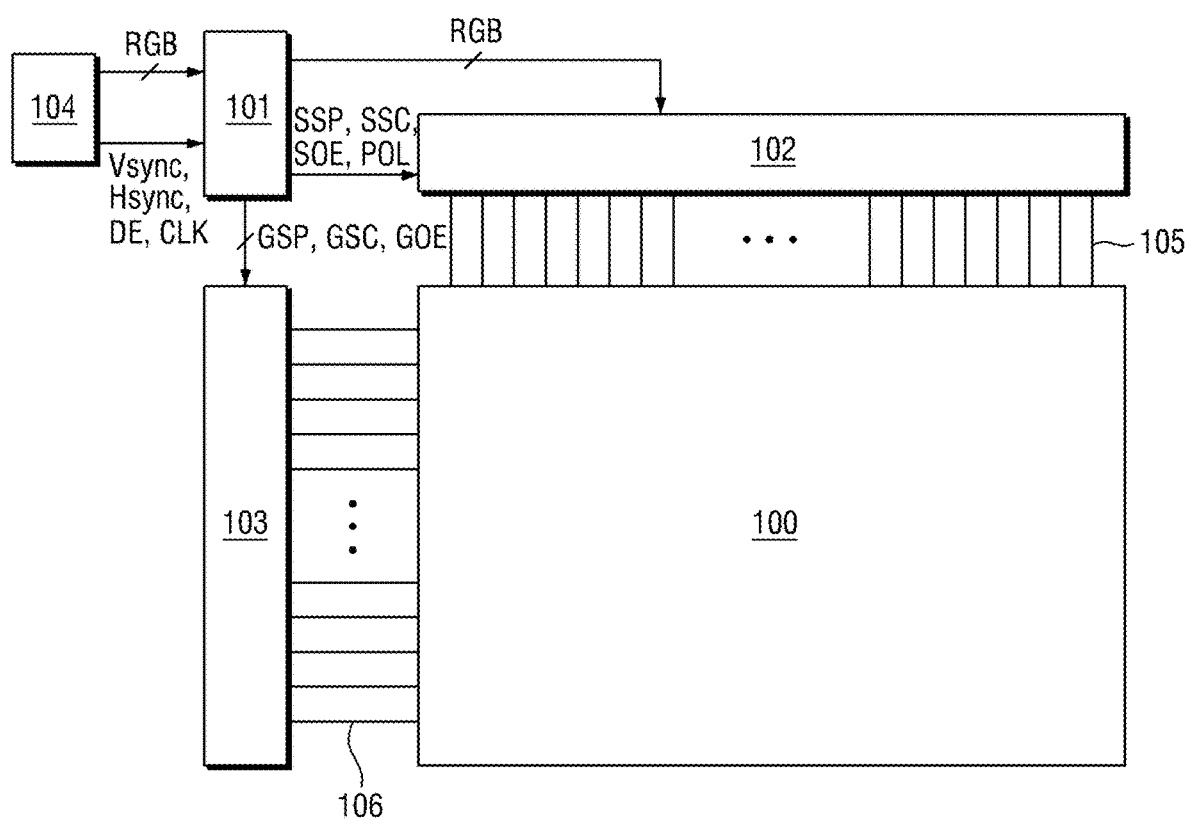
FIG. 1 is a block diagram of a display device according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described with reference to the attached drawings. Hereinafter, the thin film transistor array substrate according to exemplary embodiments will be exemplarily be described as a liquid crystal display, however, the inventive concepts are not limited thereto, and may be applied to an organic light emitting display in some exemplary embodiments.

Figure 2:
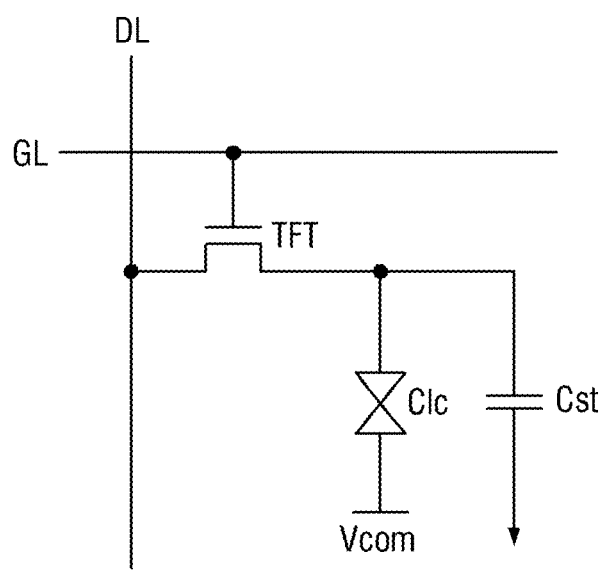
FIG. 2 is an exemplary circuit diagram of the display device of FIG. 1.

FIG. 1 is a block diagram of a display device according to an exemplary embodiment of the present disclosure. FIG. 2 is a circuit diagram showing the display device of FIG. 1.

Referring to FIG. 1, a display device according to an exemplary embodiment includes a display panel 100, a data driver 102, a gate driver 103, and a timing controller 101. A backlight unit for uniformly irradiating light onto the display panel 100 may be disposed under the display panel 100. The backlight unit may be a direct-lit backlight unit or an edge-lit backlight unit.

The display panel 100 includes a TFT array substrate (or a first substrate) and a color filter array substrate (or a second substrate) facing each other, with the liquid crystal layer interposed therebetween. In the display panel 100, a pixel array for displaying video data is formed. The pixel array includes pixels arranged in a matrix, each of the pixel disposed at the respective intersection of data lines and gate lines, to display video data.

The pixels may include R pixels, G pixels, and B pixels. The liquid-crystal cells in the pixels adjust the amount of transmitted light by the electric field difference between the data voltage applied to the pixel electrode and the common voltage applied to the common electrode, thereby displaying images of the video data. The common electrode may be formed on the color filter array substrate in a vertical electric field driving manner, such as twisted nematic (TN) mode and vertical alignment (VA) mode, or may be formed on the TFT array substrate together with the pixel electrodes in a horizontal electric field driving manner, such as the in-plane switching (IPS) mode and the fringe field switching (FFS) mode.

The TFT array substrate includes data lines, gate lines, thin-film transistors, pixel electrodes connected to the thin-film transistors, respectively, and storage capacitors Cst connected to the pixel electrodes, respectively, etc. A black matrix and a color filter may be formed on the color filter array substrate of the display panel 100. A polarizer may be attached to each of the color filter array substrate and the TFT array substrate of the display panel 100, and an alignment layer for setting a pre-tilt angle of the liquid crystals may be formed therein.

The liquid-crystal display panel 100 may be implemented as any of a TN mode, a VA mode, an IPS mode, and an FFS mode in an exemplary embodiment. The liquid-crystal display device according to an exemplary embodiment may be implemented in any form, such as a transmissive liquid-crystal display device, a transflective liquid-crystal display device, and a reflective liquid-crystal display device. The transmissive liquid-crystal display device and the transflective liquid-crystal display device require a backlight unit. The backlight unit may be a direct-lit backlight unit or an edge-lit backlight unit.

The data driver 102 includes a plurality of source drive ICs. Output channels of the source drive ICs are connected to the data lines of the pixel array, respectively. Each of the source drive ICs receives digital video data from the timing controller 101. The source drive ICs convert digital video data into a positive/negative data voltage in response to a source timing control signal from the timing controller 101, and supply the converted data voltage to data lines of the pixel array through the output channels. The source drive ICs supply data voltages of opposite polarities to adjacent data lines under the control of the timing controller 101, maintain the polarities of the data voltages supplied to the respective data lines for one frame time, and then invert the polarities of the data voltages in the next frame time. In this manner, the source drive ICs maintain the polarities of the data voltages for one frame time substantially the same as the column inversion scheme, and invert the polarities of the data voltages for every one frame time.

The gate driver 103 sequentially supplies a gate pulse to the gate lines of the pixel array in response to a gate timing control signal from the timing controller 101. The timing controller 101 supplies digital video data input from an external system board 104 to the source drive ICs of the data driving circuit 102. In addition, the timing controller 101 generates the source timing control signal for controlling the operation timing of the data driver 102 and the gate timing control signal for controlling the operation timing of the gate driver 103.

Referring to FIG. 2, the display device according to an exemplary embodiment converts the digital video data into an analog data voltage based on a gamma reference voltage and supplies the analog data to the data line DL, and simultaneously supplies a scan pulse to the gate line GL to charge the liquid-crystal cell Clc with the data voltage. To this end, the gate electrode of a thin-film transistor TFT is connected to the gate line GL, the source electrode is connected to the data line DL, and the drain electrode of the thin-film transistor TFT is connected to the pixel electrode of the liquid-crystal cell Clc and one electrode of the storage capacitor Cst. A common voltage Vcom is supplied to the common electrode of the liquid-crystal cell Clc. The storage capacitor Cst charges a data voltage applied from the data line DL when the thin-film transistor is turned on to maintain a constant voltage of the liquid-crystal cell Clc. When the scan pulse is applied to the gate line GL, the thin-film transistor is turned on to form a channel between the source electrode and the drain electrode, so that the voltage on the data line DL is supplied to the pixel electrode of the liquid-crystal cell Clc. At this time, the liquid-crystal molecules of the liquid-crystal cell Clc change the incident light by changing the alignment by the electric field between the pixel electrode and the common electrode. In this manner, the display device is driven according to an exemplary embodiment.

The schematic configuration of the display device has been described above according to an exemplary embodiment. Hereinafter, the pixel structure of the display panel of the display device will be described in detail. It is to be noted that different reference numerals from those of FIGS. 1 and 2 will be used.

Figure 3:
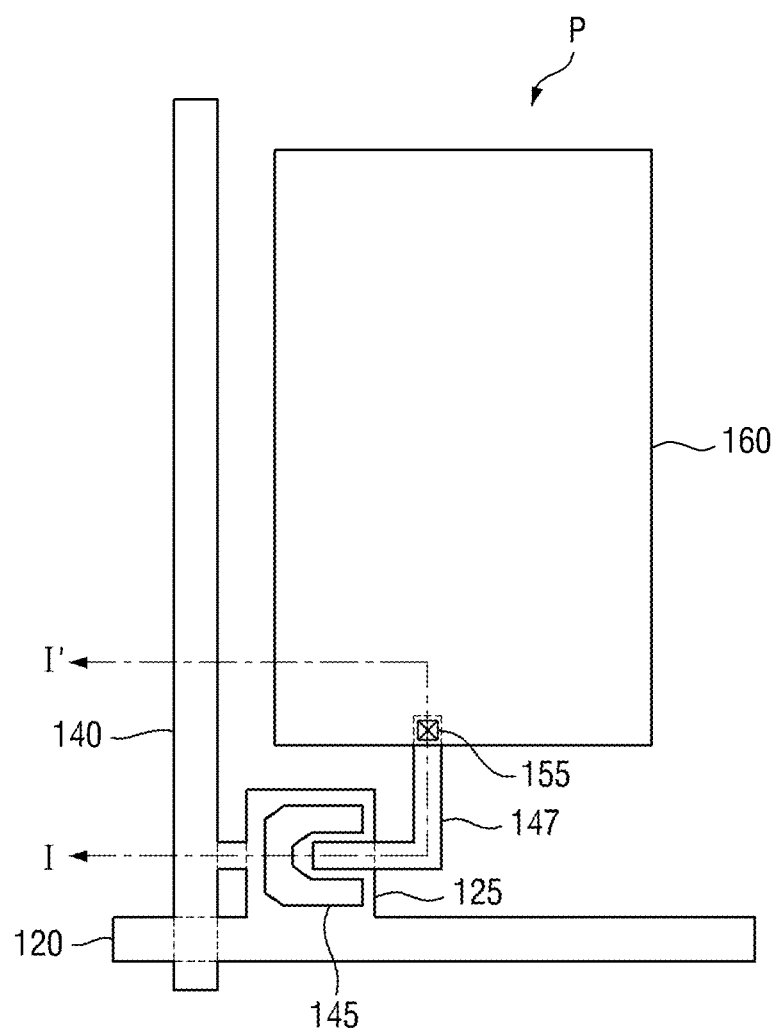
FIG. 3 is a plan view of a pixel of a display device according to an exemplary embodiment.

FIG. 3 is a plan view showing a pixel of a display device according to an exemplary embodiment.

Referring to FIG. 3, in a pixel of the display device according to the exemplary embodiment, a gate line 120 extended in one direction and a data line 140 intersecting the gate line 120 define each of the pixels P and are disposed on a substrate. The gate line 120 is extended in one direction, e.g., in the horizontal direction, and transmits a gate signal to the pixel P. A number of gate lines 120 are arranged in the same direction in parallel with one another. The data line 140 is extended in a direction intersecting the gate line 120, for example, in the vertical direction, to transmit a data signal to the pixel P. A number of data lines 140 are arranged in the same direction in parallel with one another.

A gate electrode 125 branching off from the gate line 120 is located at the intersection of the gate line 120 and the data line 140. In FIG. 3, the gate electrode 125 branches off from the gate line 120 to have a protruding shape. However, the inventive concepts are not limited thereto. For example, in some exemplary embodiments, the gate line 120 may overlap with the source electrode 145 and the drain electrode 147 so that the gate line 120 itself may function as the gate electrode.

The source electrode 145 branching off from the data line 140 and the drain electrode 147 spaced apart from the source electrode 145 overlap the gate electrode 125. Although the source electrode 145 is exemplarily shown as having a 'U' shape in FIG. 3, in some exemplary embodiments, the source electrode 145 may have formed in an 'I' shape.

A pixel electrode 160 connected to the drain electrode 147 is disposed in the pixel P. The pixel electrode 160 has a square shape in the pixel P. However, the inventive concepts are not limited thereto. In some exemplary embodiments, the pixel electrode 160 may include a plurality of slits or may have a finger shape. The pixel electrode 160 is electrically connected to the drain electrode 147 through a via hole 155. The pixel electrode 160 overlaps the common electrode, and forms the horizontal and vertical electric fields between the pixel electrode 160 and the common electrode in order to drive the liquid crystals.

Figure 4:
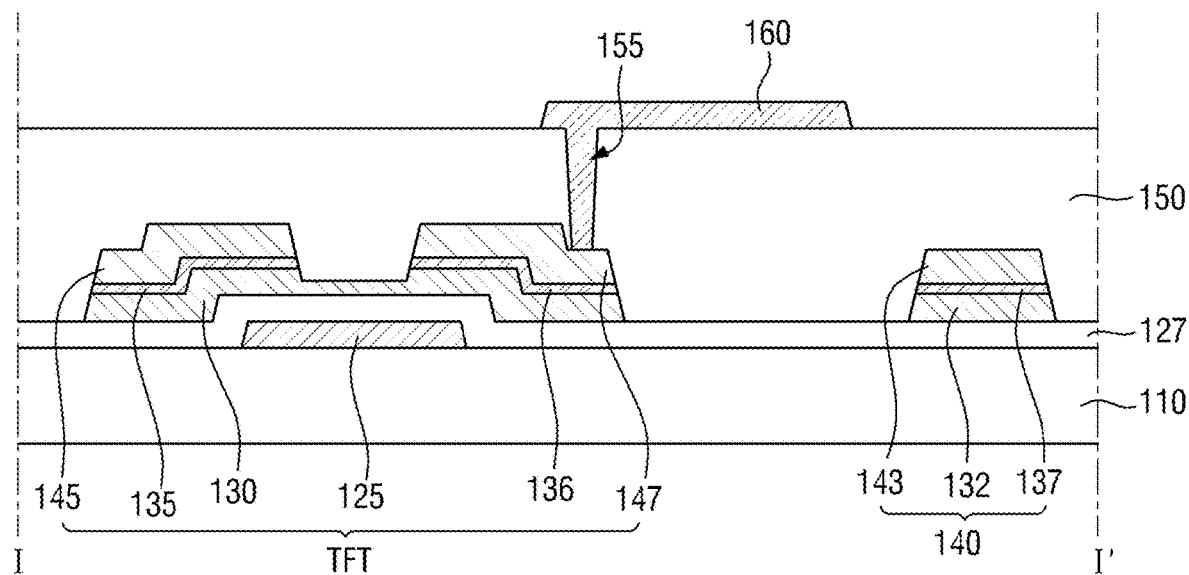
FIG. 4 is a cross-sectional view taken along line I-I' of FIG. 3.

FIG. 4 is a cross-sectional view taken along line I-I' of FIG. 3. Referring to FIG. 4, a cross-sectional structure of the pixel P of the display device will be described in more detail.

Referring to FIG. 4, the gate electrode 125 is disposed on a transparent substrate 110, such as glass. The gate electrode 125 may be made of one selected from the group consisting of: molybdenum (Mo), aluminum (Al), chromium (Cr), gold (Au), titanium (Ti), nickel (Ni), neodymium (Nd), and copper (Cu), or an alloy thereof. In addition, the gate electrode 125 may be formed as multiple layers including one selected from the group consisting of: molybdenum (Mo), aluminum (Al), chromium (Cr), gold (Au), titanium (Ti), nickel (Ni), neodymium (Nd), and copper (Cu), or an alloy thereof. For example, the gate electrode 125 may be a double layer of molybdenum/aluminum-neodymium or molybdenum/aluminum.

A gate insulating layer 127 is disposed on the gate electrode 125 to isolate the gate electrode 125. The gate insulating layer 127 may be formed as a single layer or multiple layers including silicon oxide ($SiO_x$), silicon nitride ($SiN_x$), or silicon oxynitride ($SiO_xN_y$).

A semiconductor layer 130 is disposed on the gate electrode 125. The semiconductor layer 130 may be formed of a silicon semiconductor or an oxide semiconductor. Silicon semiconductor may include amorphous silicon or crystallized polycrystalline silicon. The polycrystalline silicon has a high mobility (100 $cm^2$/Vs or higher), low energy consumption, and excellent reliability, and thus, it can be applied for a driving thin-film transistor in the pixel. The oxide semiconductor has low off-current, and thus, it may be applied for a switching thin-film transistor having a short on-time and a long off-time. However, the semiconductor layer 130 is not limited thereto. In some exemplary embodiments, the oxide semiconductor may be applied for the driving thin-film transistor or the silicon semiconductor may be applied for the switching thin-film transistor. According to an exemplary embodiment, the semiconductor layer 130 is formed of silicon semiconductor. In addition, the semiconductor layer 130 includes a drain region and a source region including a p-type or n-type impurities, respectively, and a channel therebetween.

The source electrode 145 and the drain electrode 147 spaced apart from each other are disposed on the semiconductor layer 130. The source electrode 145 branches off and protrudes from the data line 140 to be located in the source region of the semiconductor layer 130. The drain electrode 147 is spaced apart from the source electrode 145 and located in the drain region of the semiconductor layer 130.

The source electrode 145 and the drain electrode 147 may be formed as a single layer or multiple layers. When the source electrode 145 and the drain electrode 147 is made up of a single layer, the single layer may include one selected from the group consisting of: molybdenum (Mo), aluminum (Al), chromium (Cr), gold (Au), titanium (Ti), nickel (Ni), neodymium (Nd), and copper (Cu), or an alloy thereof. In addition, when the source electrode 145 and the drain electrode 147 are formed as multiple layers, the multiple layers may include double layers of copper/titanium or molybdenum/aluminum-neodymium, triple layers of titanium/aluminum/titanium, molybdenum/aluminum/molybdenum or molybdenum/aluminum-neodymium/molybdenum.

Ohmic contact layers 135 and 136 are disposed between the semiconductor layer 130 and the source electrode 145 and between the semiconductor layer 130 and the drain electrode 147, respectively. The ohmic contact layers 135 and 136 may be disposed between the source electrode 145 and the semiconductor layer 130 and between the drain electrode 147 and the semiconductor layer 130, respectively, to lower the contact resistance by lowering a Schottky barrier height, i.e., a work function, between the metal and the silicon. The ohmic contact layers 135 and 136 may be made of amorphous silicon highly doped with n-type impurities. A portion of the semiconductor layer 130 between the ohmic contact layers 135 and 136 spaced apart from each other may function as the channel of the semiconductor layer 130.

Accordingly, a thin-film transistor TFT including the gate electrode 125, the semiconductor layer 130, the ohmic contact layers 135 and 136, the source electrode 145, and the drain electrode 147 is formed.

The data line 140 is spaced apart from the thin-film transistor TFT. The data line 140 includes a first layer 132, a second layer 137, and a third layer 143. The first layer 132 may be made of silicon as in the semiconductor layer 130. The second layer 137 may be made of silicon as in the ohmic contact layers 135 and 136. The third layer 143 may be made of metal as in the source and drain electrodes 145 and 147. The data line 140 may be fabricated via the same mask process, and may have a structure in which the first to third layers 132, 137, and 143 are stacked and patterned.

A passivation layer 150 is disposed over the thin-film transistor TFT and the data line 140. The passivation layer 150 functions as a planarization film to protect the elements thereunder and provide a flat surface over step differences. The passivation layer 150 includes the via hole 155 by which the drain electrode 147 of the thin-film transistor TFT is exposed.

The passivation layer 150 covers the thin-film transistor TFT and the data line 140. The passivation layer 150 may be made of an inorganic material or an organic material. When the passivation layer 150 is made of an inorganic material, the passivation layer 150 may include a single layer of silicon oxide ($SiO_x$), silicon nitride ($SiN_x$), or silicon oxynitride ($SiO_xN_y$), or multiple layers thereof. When the passivation layer 150 is made of an organic material, the passivation layer 150 may include polyimide, benzocyclobutene series resin, and acrylate series resin, for example.

The pixel electrode 160 is disposed on the passivation layer 150. The pixel electrode 160 is electrically connected to the drain electrode 147 of the thin-film transistor TFT through the via hole 155 of the passivation layer 150. The pixel electrode 160 may be formed of a transparent electrode through which light can pass. The pixel electrode 160 may be made of, for example, indium tin oxide (ITO), indium zinc oxide (IZO), or indium tin zinc oxide (ITZO). However, the inventive concepts are not limited thereto. In some exemplary embodiments, the pixel electrode 160 may be made of any material as long as the material is transparent and has high work function.

The TFT array substrate used in the display device according to an exemplary embodiment shown in FIG. 4 described above may be fabricated via a variety of mask processes as follows. Although FIG. 4 does not specifically show the features on each layer of the thin-film transistor, they will be described in more detail in the method of fabricating a TFT array substrate to be described later.

Hereinafter, a variety of processes of fabricating the TFT array substrate according to an exemplary embodiment will be described.

FIGS. 5 to 14 are cross-sectional views illustrating processing steps of a method of fabricating a TFT array substrate according to an exemplary embodiment.

Figure 5:
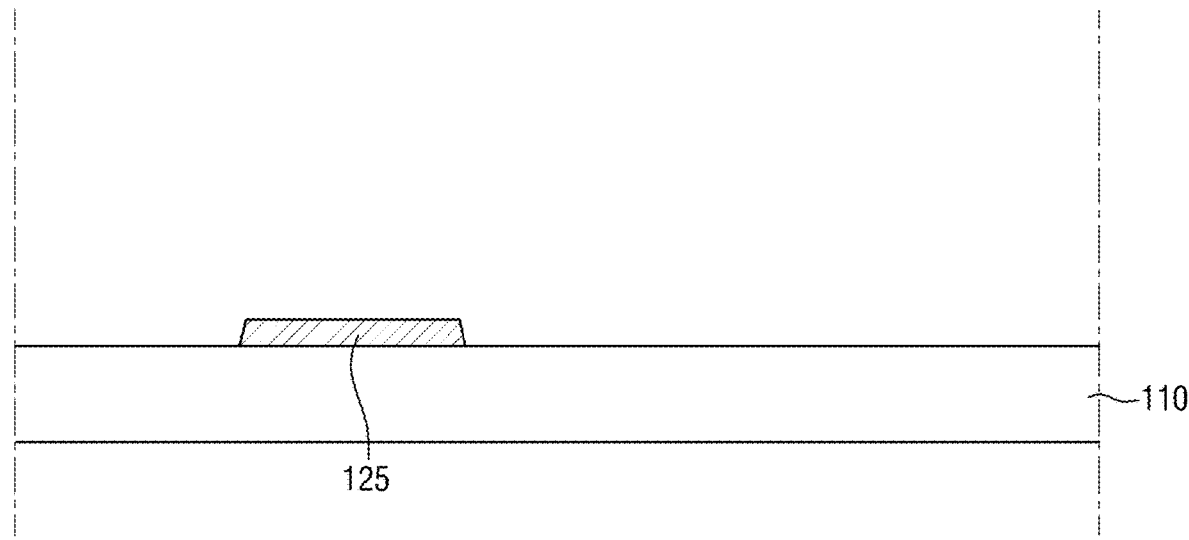
FIGS. 5, 6, 7, 8, 9, 10, 11, 12, 13, and 14 are cross-sectional views illustrating processing steps of a method of fabricating a TFT array substrate according to an exemplary embodiment.

Referring to FIG. 5, a first metal material is disposed on a substrate 110 to form a first metal layer, and then the first metal layer is patterned by performing photolithography using a photoresist, so that a gate electrode 125 is formed.

More specifically, a first metal material selected from the group consisting of: molybdenum (Mo), aluminum (Al), chromium (Cr), gold (Au), titanium (Ti), nickel (Ni), neodymium (Nd), and copper (Cu) is disposed on the substrate 110 to form the first metal layer. Subsequently, a photoresist layer is formed on the entire surface of the first metal layer by coating a photoresist, such as spin coating. A first mask is placed above the photoresist layer, and then an exposure process of irradiating ultra violet (UV) is carried out. A developing solution is applied onto parts of the photoresist layer exposed to the UV, and the exposed parts are removed via a developing process, so that a photoresist pattern is formed.

There are generally two types of photoresist: negative and positive. Positive photoresist has a mechanism in which parts irradiated with UV are removed by the developing solution. Negative photoresist has a mechanism in which the parts irradiated with UV are not removed by the developing solution, and the parts not irradiated are removed instead. Hereinafter, the process will be described with reference to a positive photoresist, however, in some exemplary embodiments, a negative photoresist may also be used during manufacture.

Subsequently, the first metal layer exposed by the photoresist pattern is subjected to wet etching with an etchant, so that the gate electrode 125 is formed. Then, the photoresist pattern remaining on the gate electrode 125 is stripped and removed, so that the gate electrode 125 is formed by using the photolithography. In doing so, the gate electrode 125 formed on the substrate 110 may be made up of a single layer or two or more layers using the above-described first metal material. In the drawings, the gate electrode 125 is exemplarily shown as having a single layer structure.

Figure 6:
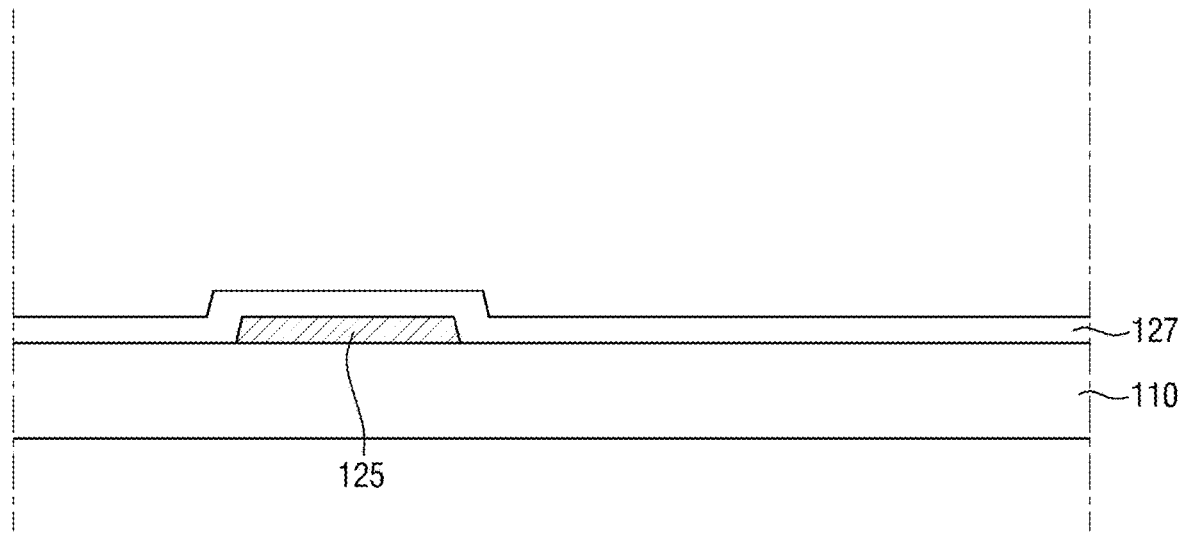

Referring to FIG. 6, a gate insulating layer 127 is formed over the gate electrode 125 on the substrate 110. The gate insulating layer 127 electrically isolates the gate electrode 125, and may be made up of a single layer or multiple layers including silicon oxide ($SiO_x$), silicon nitride ($SiN_x$), or silicon oxynitride ($SiO_xN_y$).

Figure 7:
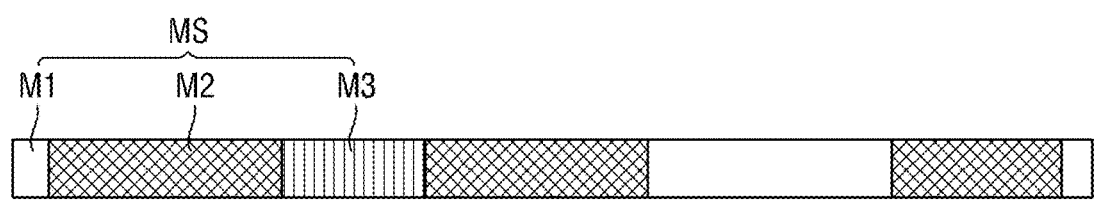
Figure 7:
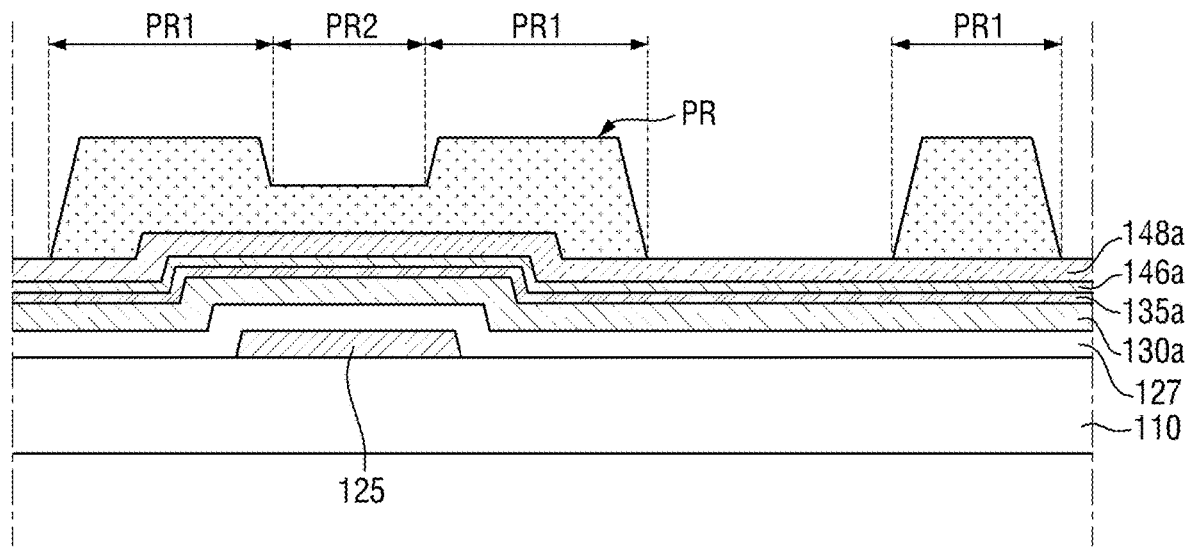

Referring to FIG. 7, pure amorphous silicon (a-Si) and impurity amorphous silicon (n+a-Si) are sequentially deposited on the gate insulating layer 127 to form a first amorphous silicon layer 130a and a second amorphous silicon layer 135a. Subsequently, a second metal material is deposited on the second amorphous silicon layer 135a to form a second metal layer 146a, and a third metal material is deposited on the second metal layer 146a to form a third metal layer 148a.

Each of the second metal layer 146a and the third metal layer 148a may be made of one selected from the group consisting of: molybdenum (Mo), aluminum (Al), chromium (Cr), gold (Au), titanium (Ti), nickel (Ni), neodymium (Nd), and copper (Cu). According to an exemplary embodiment, the second metal layer 146a is made of titanium (Ti), and the third metal layer 148a is made of copper (Cu).

Subsequently, a photoresist layer is formed on the third metal layer 148a by coating a photoresist, such as spin coating. Subsequently, the photoresist pattern PR is formed by exposing and developing using a second mask.

More specifically, a second mask MS, which is a half-tone mask, is placed above a photoresist layer. The second mask includes a transmissive region M1 through which light is transmitted, a non-transmissive region M2 through which light is blocked, and a transflective region M3 through which the amount of light transmitted is adjusted. Subsequently, an exposure process of irradiating UV toward the substrate 110 from above the second mask MS is carried out. The second mask MS is placed to align the non-transmissive region M2 with regions where the semiconductor layer, the source electrode, the drain electrode and the data line are to be formed, the transflective region M3 with regions where the spacing between the source electrode and the drain electrode is to be formed, and the transmissive region M1 with the remaining regions. Accordingly, the region in line with the non-transmissive region M2 where the semiconductor layer, the source electrode, the drain electrode and the data line are to be formed is not irradiated with UV, the remaining region in line with the transmissive region M1 is irradiated with UV, and the region between the source electrode and the drain electrode in line with the transflective region M3 is irradiated with an adjusted amount of UV.

Subsequently, a developing solution is applied onto the exposed photoresist layer to perform a developing process, so that a photoresist pattern PR is formed. According to the developing process, a first photoresist region PR1 having a first thickness is formed in the regions on the third metal layer 148a where the source electrode, the drain electrode and the data line are to be formed, and a second photoresist region PR2 having a second thickness less than the first thickness is formed in the regions where the spacing between the source electrode and the drain electrode is to be formed. In the remaining regions, the photoresist layer is completely removed so that the third metal layer 148a is exposed.

Figure 8:
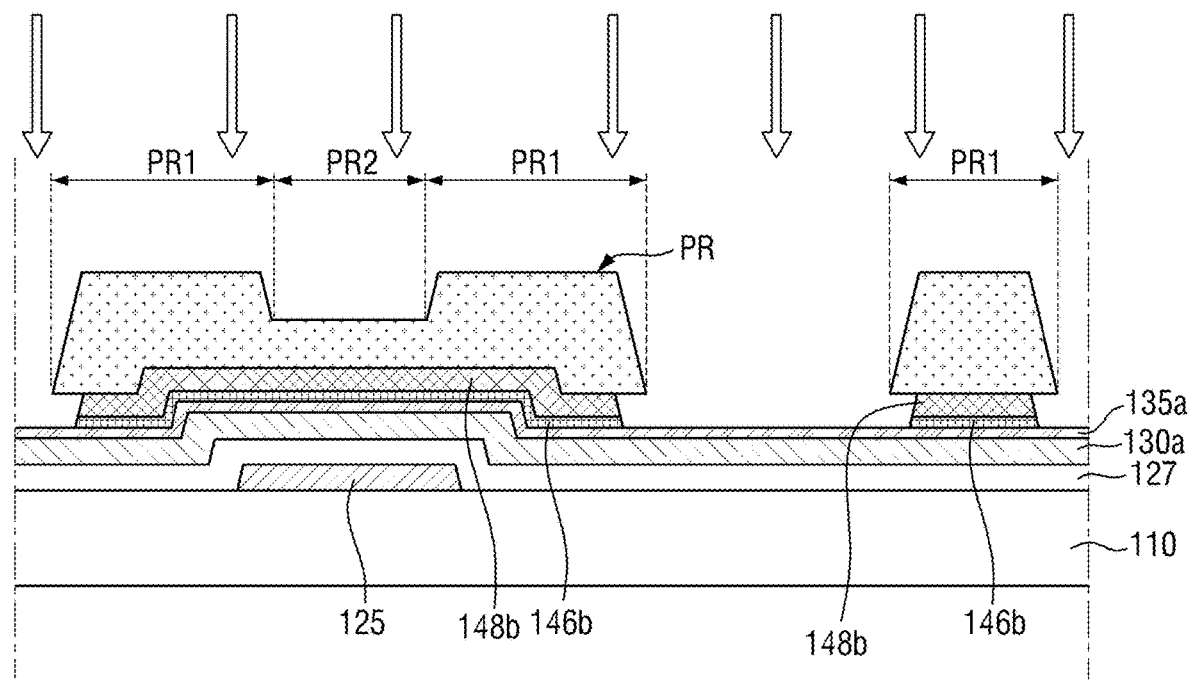

Subsequently, referring to FIG. 8, the second metal layer 146a and the third metal layer 148a are subjected to wet etching using an etchant except the first photoresist region PR1 and the second photoresist region PR2, so that the second metal layer 146a and the third metal layer 148a are removed. In this manner, the second metal layer pattern 146b and the third metal layer pattern 148b where the source electrode, the drain electrode and the data line are to be formed are formed in regions in line with the first photoresist region PR1 and the second photoresist region PR2.

The etchant for etching the second metal layer 146a and the third metal layer 148a is capable of etching the second metal layer 146a together with the third metal layer 148a. In addition, due to the nature of the wet etching process, the second metal layer pattern 146b and the third metal layer pattern 148b may be overly etched to have an undercut in the first photoresist region PR1 and the second photoresist region PR2.

Figure 9:
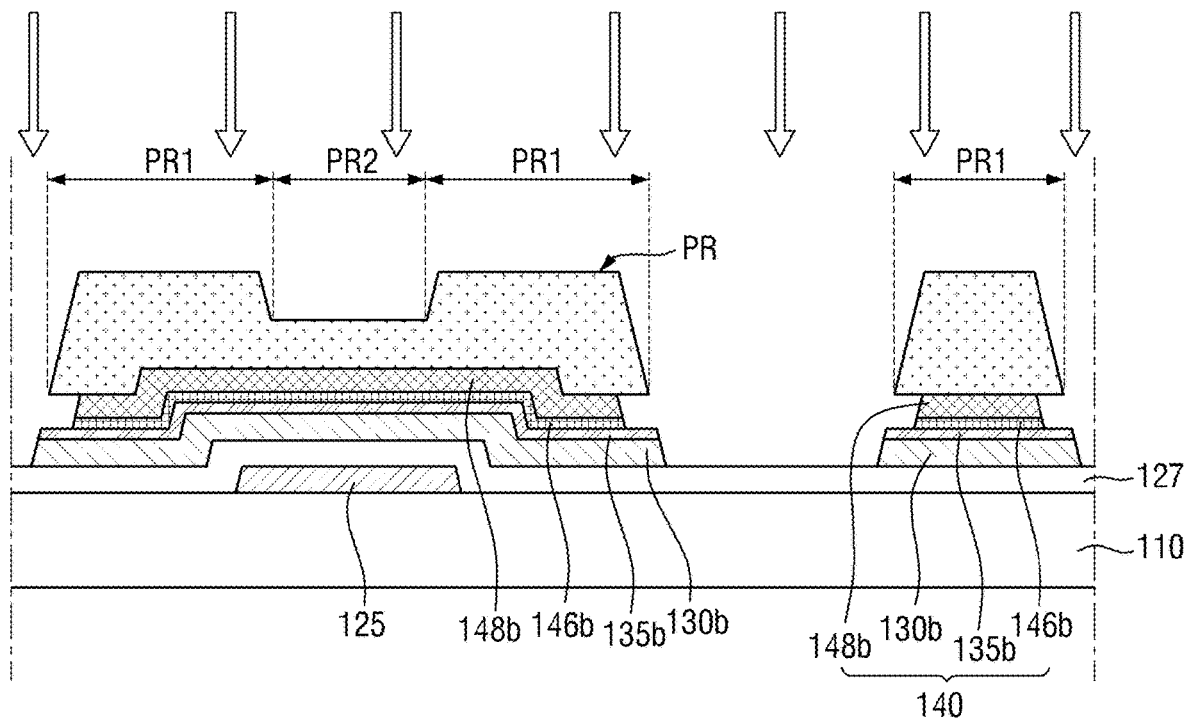

Subsequently, referring to FIG. 9, dry etching is carried out on the exposed second amorphous silicon layer 135a using the photoresist pattern PR including the first photoresist region PR1 and the second photoresist region PR2 as a mask. Then, the semiconductor pattern 130b to be formed as the semiconductor layer and the data line, and the ohmic pattern 135b to be formed as the ohmic contact layer and the data line are formed.

More specifically, the second amorphous silicon layer 135a exposed out of the photoresist pattern PR and the first amorphous silicon layer 130a disposed under the second amorphous silicon layer 135a are removed by dry etching. Due to the nature of the dry etching process, the pattern may be etched to have an area similar to that of the photoresist pattern PR. In this manner, the semiconductor pattern 130b and the ohmic pattern 135b have a larger area than the second metal layer pattern 146b and the third metal layer pattern 148b. More particularly, the semiconductor pattern 130b and the ohmic pattern 135b protrude from the side surfaces of the second metal layer pattern 146b and the third metal layer pattern 148b, respectively.

In addition, the data line 140 including the semiconductor pattern 130b, the ohmic pattern 135b, the second metal layer pattern 146b, and the third metal layer pattern 148b is fabricated via the dry etching process.

Figure 10:
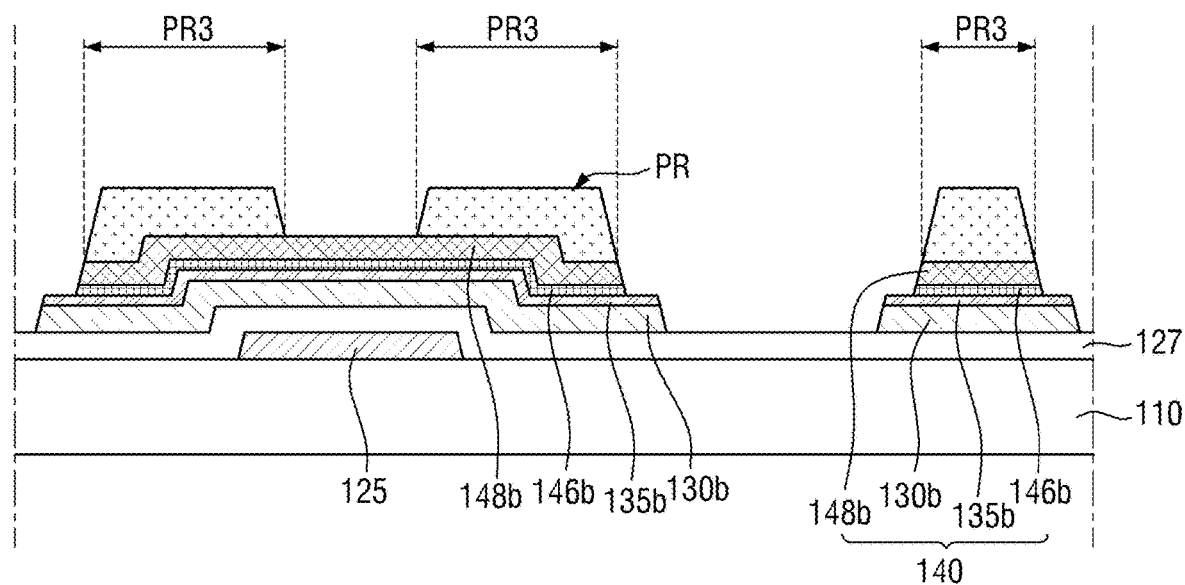

Subsequently, referring to FIG. 10, an ashing process is carried out on the photoresist pattern PR remaining on the substrate 110. Ashing is carried out to reduce the thickness and area of the first photoresist region PR1 and also to remove the second photoresist region PR2 having the second thickness. Accordingly, after the ashing process, the second photoresist region PR2 having the second thickness is removed, and the thickness of the first photoresist region PR1 is reduced, to form the third photoresist region PR3 having a third thickness. In doing so, the side surface of the third photoresist region PR3 becomes similar to the side surfaces of the second metal layer pattern 146b and the third metal layer pattern 148b disposed thereunder as the thickness and the area of the third photoresist region PR3 are reduced by the ashing. The side surfaces of the semiconductor pattern 130b and the ohmic pattern 135b protrude from the side surfaces of the third photoresist region PR3. In addition, as the second photoresist region PR2 is removed, the third metal layer pattern 148b previously in line with the second photoresist region PR2 is exposed.

Subsequently, referring to FIG. 11, wet etching is carried out on the substrate 110 on which the photoresist pattern PR including the third photoresist region PR3 is formed so, that the ohmic contact layers 135 and 136, the source electrode 145, and the drain electrode 147 are formed.

More specifically, the third metal layer pattern 148b not overlapping with the third photoresist region PR3 of the photoresist pattern PR is removed via a wet etching process, so that the first electrode pattern 146c and the second electrode pattern 148c spaced apart from each other are formed. The first electrode pattern 146c is formed by etching the second metal layer pattern 146b, and the second electrode pattern 148c is formed by etching the third metal layer pattern 148b. Accordingly, the source electrode 145 where the first electrode pattern 146c is stacked, and the drain electrode 147 where the second electrode pattern 148c is stacked are formed. Due to the nature of the wet etching process, the source electrode 145 and the drain electrode 147 are formed to have an undercut in the third photoresist region PR3.

In addition, the ohmic pattern 135b not overlapping the third photoresist region PR3 of the photoresist pattern PR is etched, so that the ohmic contact layers 135 and 136 spaced apart from each other are formed. The etchant used for the wet etching may contain F components, and thus, the ohmic pattern 135b can be etched as well. As such, the ohmic contact layers 135 and 136 are formed between the source electrode 145 and the semiconductor layer 130 and between the drain electrode 147 and the semiconductor layer 130, respectively. The ohmic contact layers 135 and 136 have a smaller etching rate to the etchant that that of the source electrode 145 and the drain electrode 147, and thus, ohmic contact layers 135 and 136 have a larger area than that of the source electrode 145 and the drain electrode 147.

Figure 12:
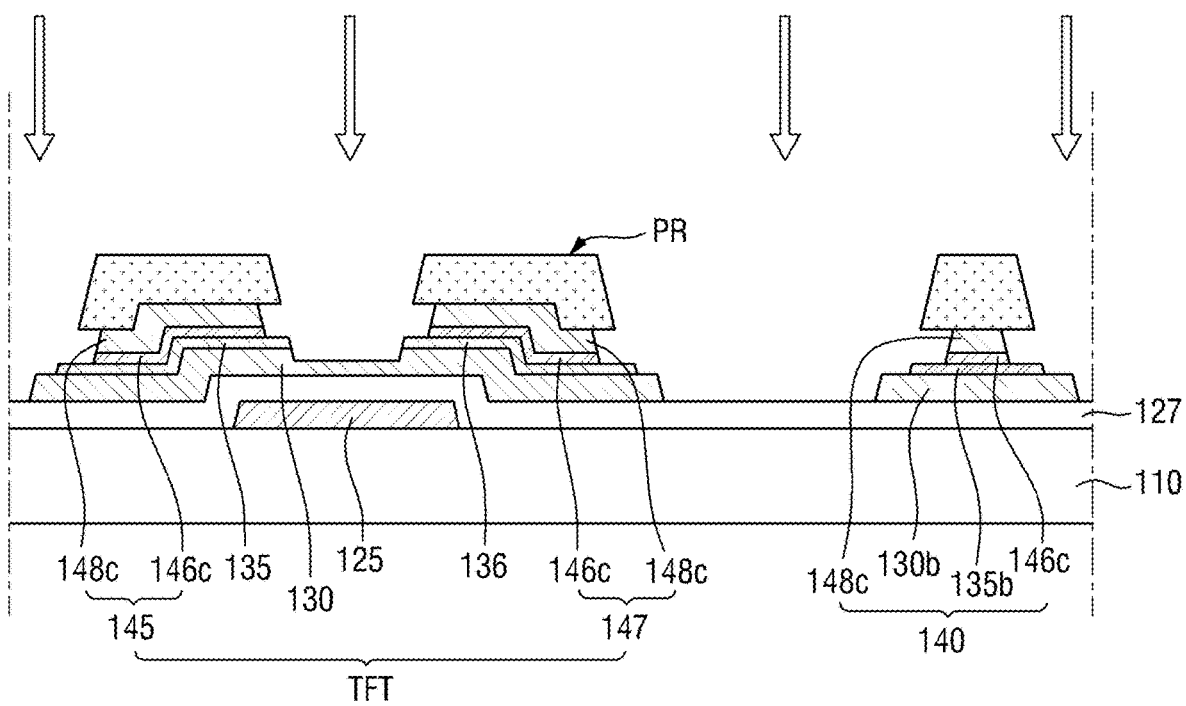

Subsequently, referring to FIG. 12, dry etching is carried out on the substrate 110 on which the photoresist pattern PR including the third photoresist region PR3 is formed, so that the ohmic pattern 135b that may possibly be retained is removed, and the semiconductor layer 130 is formed.

Specifically, when the dry etching process is carried out on the substrate 110, a portion of the semiconductor pattern 130b not overlapping with the third photoresist region PR3 is etched so that the semiconductor layer 130 is formed. More particularly, during the dry etching process, a portion of the semiconductor layer 130 is etched, so that a recess is formed in the surface of the semiconductor layer 130. As such, the spacing between the ohmic contact layers 135 and 136 function as the channel of the semiconductor layer 130.

Subsequently, the photoresist pattern PR on the substrate 110 is stripped and removed completely, so that a thin-film transistor TFT including the gate electrode 125, the semiconductor layer 130, the ohmic contact layers 135 and 136, the source electrode 145, and the drain electrode 147 is formed.

Figure 13:
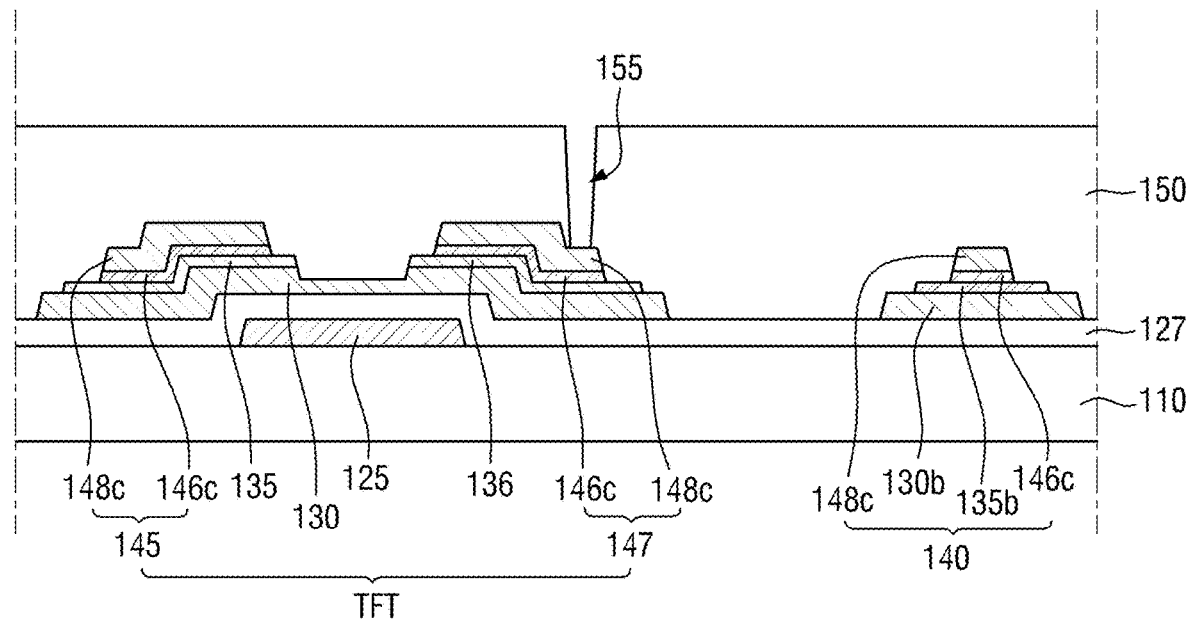

Subsequently, referring to FIG. 13, a passivation layer 150 is formed over the thin-film transistor TFT on the substrate 110. The passivation layer 150 electrically isolates the thin-film transistor TFT, protects it from the outside, and provides a flat surface over it. The passivation layer 150 may be made of an inorganic material or an organic material. When the passivation layer 150 is made of an inorganic material, the passivation layer 150 may be formed as a single layer including silicon oxide ($SiO_x$), silicon nitride ($SiN_x$), or silicon oxynitride ($SiO_xN_y$), or multiple layers thereof. When the passivation layer 150 is made of an organic material, the passivation layer 150 may include polyimide, benzocyclobutene series resin, and acrylate series resin, for example.

A third mask is placed above the passivation layer 150, and patterning is carried out by a photolithography process, so that a via hole 155 exposing the drain electrode 147 of the thin-film transistor TFT is formed.

Subsequently, referring to FIG. 14, a pixel electrode 160 is formed on the passivation layer 150. The pixel electrode 160 is formed by depositing a transparent conductive material, such as indium tin oxide (ITO), indium zinc oxide (IZO) and indium tin zinc oxide (ITZO), on the substrate 110 and then patterning it using a fourth mask. The via hole is filled with the pixel electrode 160, and thus, the pixel electrode 160 is electrically connected to the drain electrode 147. In this manner, the thin-film transistor array substrate according to an exemplary embodiment may be fabricated.

In the method of fabricating the TFT array substrate according to an exemplary embodiment described above, the semiconductor layer, the ohmic contact layer, the source electrode, and the drain electrode can be formed using a single mask, and thus, the TFT array substrate can be fabricated using a total of four masks. In this manner, the fabrication costs for the mask process can be reduced.

The above-described TFT array substrate of FIG. 4 may be fabricated via a fabrication process according to another exemplary embodiment to be described below. In the following descriptions, elements identical to those described above are given like reference numerals.

FIGS. 15 to 22 are cross-sectional views illustrating processing steps of a method of fabricating a TFT array substrate according to another exemplary embodiment.

Figure 15:
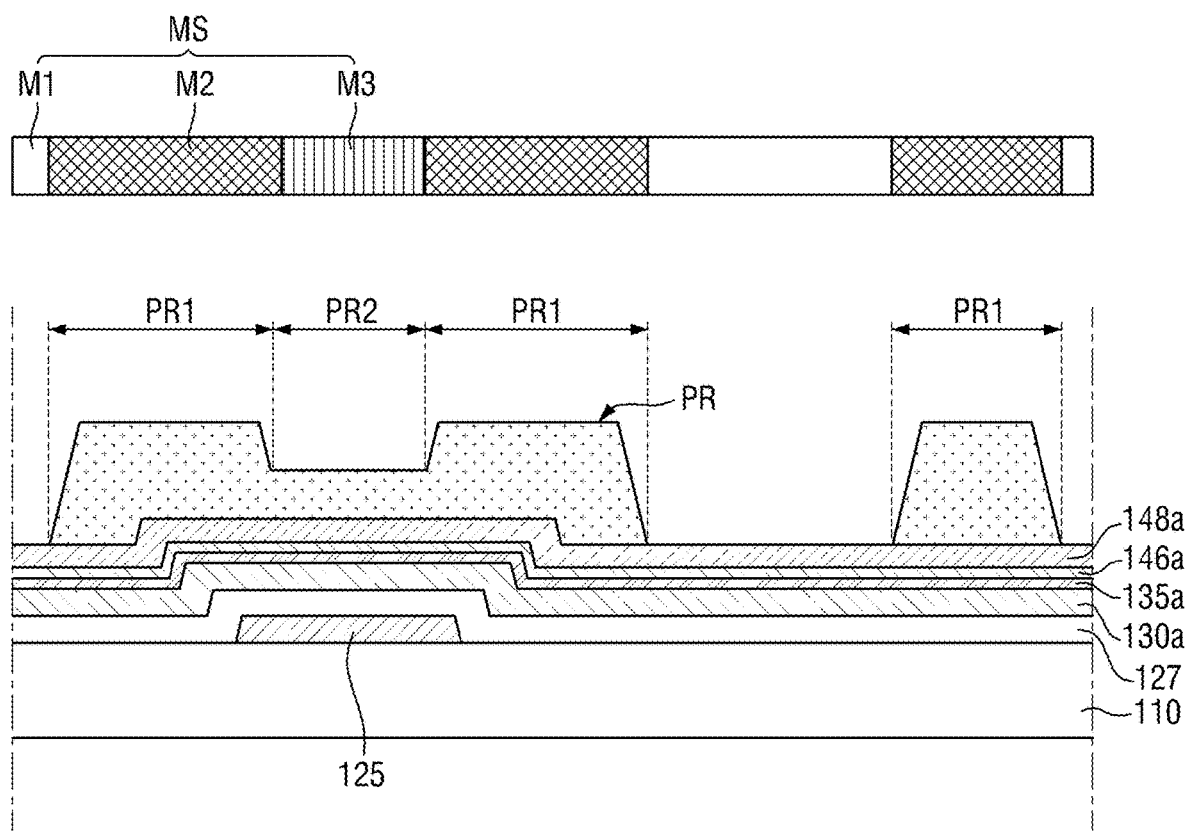
FIGS. 15, 16, 17, 18, 19, 20, 21, and 22 are cross-sectional views illustrating processing steps of a method of fabricating a TFT array substrate according to another exemplary embodiment.

Referring to FIG. 15, a first metal material is disposed on a substrate 110 to form a first metal layer, and then the first metal layer is patterned by performing photolithography using a photoresist, so that a gate electrode 125 is formed. Subsequently, a gate insulating layer 127 is formed over the gate electrode 125 on the substrate 110. Pure amorphous silicon (a-Si) and impurity amorphous silicon (n+a-Si) are sequentially deposited on the gate insulating layer 127 to form a first amorphous silicon layer 130a and a second amorphous silicon layer 135a. Subsequently, a second metal material is deposited on the second amorphous silicon layer 135a to form a second metal layer 146a, and a third metal material is deposited on the second metal layer 146a to form a third metal layer 148a.

Then, a photoresist layer is formed on the third metal layer 148a by coating a photoresist, such as spin coating. Subsequently, the photoresist pattern PR is formed by exposing and developing processes using a second mask. More specifically, the second mask MS, which is a half-tone mask, is placed above the photoresist layer. The second mask includes a transmissive region M1 through which light is transmitted, a non-transmissive region M2 through which light is blocked, and a transflective region M3 through which the amount of light is adjusted. Subsequently, an exposure process of irradiating UV toward the substrate 110 from above the second mask MS is carried out. The second mask MS is placed to align the non-transmissive region M2 with regions where the semiconductor layer, the source electrode, the drain electrode, and the data line are to be formed, the transflective region M3 with regions where the spacing between the source electrode and the drain electrode is to be formed, and the transmissive region M1 with the remaining regions. Accordingly, the region in line with the non-transmissive region M2 where the semiconductor layer, the source electrode, the drain electrode, and the data line are to be formed is not irradiated with UV, the remaining region in line with the transmissive region M1 is irradiated with UV, and the region between the source electrode and the drain electrode in line with the transflective region M3 is irradiated with an adjusted amount of UV.

Subsequently, a developing solution is applied onto the exposed photoresist layer to perform a developing process, such that a photoresist pattern PR is formed. According to the developing process, a first photoresist region PR1 having a first thickness is formed in the regions of the third metal layer 148a where the source electrode, the drain electrode, and the data line are to be formed, and a second photoresist region PR2 having a second thickness less than the first thickness is formed in the regions where the spacing between the source electrode and the drain electrode is to be formed. In the remaining regions, the photoresist layer is completely removed so that the third metal layer 148a is exposed.

Figure 16:
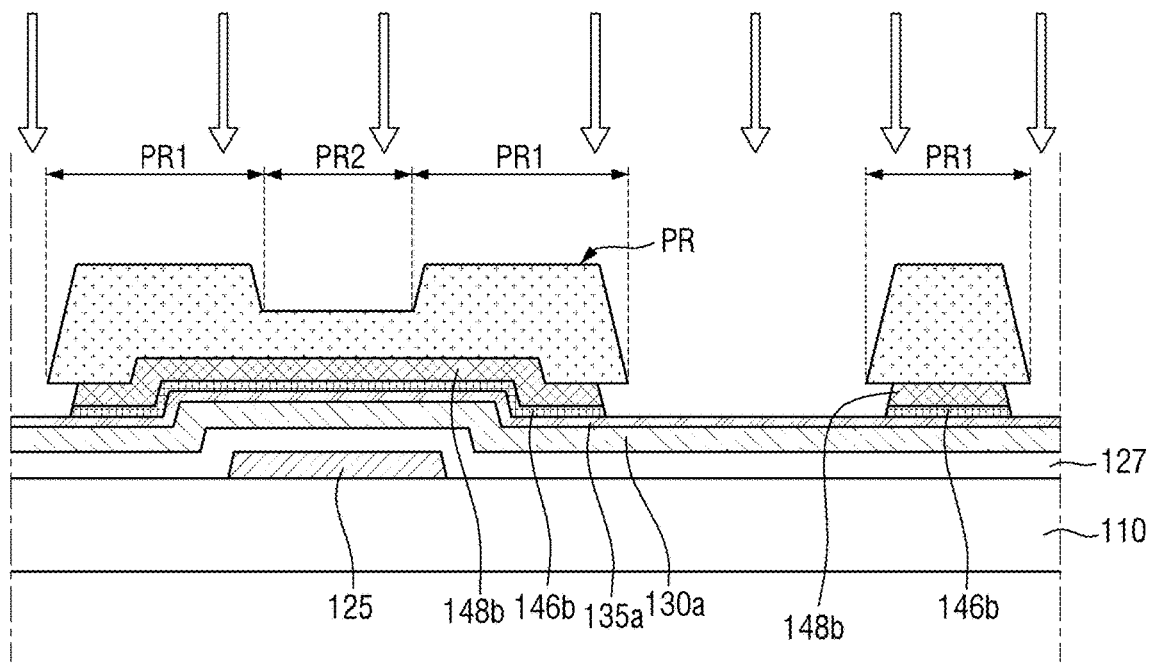

Subsequently, referring to FIG. 16, a wet etching process is carried out on the substrate 110 using an etchant, so that the second metal layer 146a and the third metal layer 148a not overlapping with the first photoresist region PR1 and the second photoresist region PR2 are removed. In this manner, the second metal layer pattern 146b and the third metal layer pattern 148b where the source electrode, the drain electrode, and the data line are to be formed are formed in regions in line with the first photoresist region PR1 and the second photoresist region PR2.

The etchant for etching the second metal layer 146a and the third metal layer 148a is capable of etching the second metal layer 146a together with the third metal layer 148a. In addition, due to the nature of the wet etching process, the second metal layer pattern 146b and the third metal layer pattern 148b are overly etched to have an undercut in the first photoresist region PR1 and the second photoresist region PR2.

Figure 17:
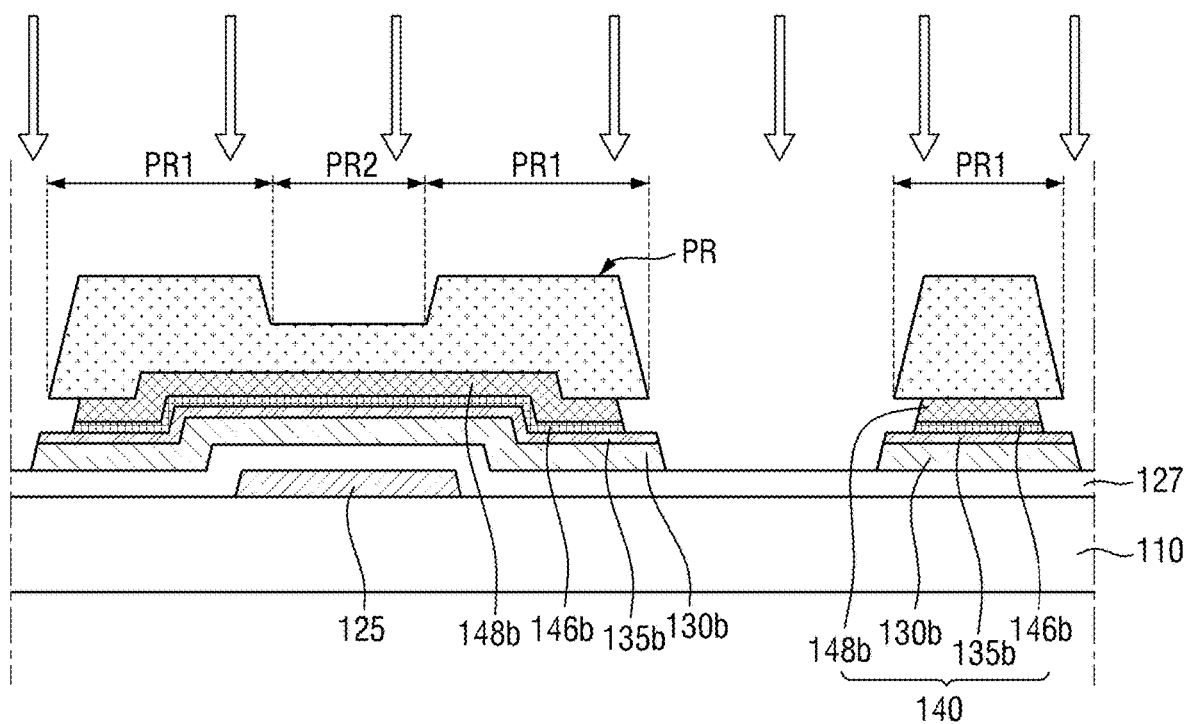

Subsequently, referring to FIG. 17, dry etching is carried out on the second amorphous silicon layer 135a not overlapping with the first photoresist region PR1 and the second photoresist region PR2 of the photoresist pattern PR. As such, the semiconductor pattern 130b may be formed as the semiconductor layer and the data line, and the ohmic pattern 135b may be formed as the ohmic contact layer and the data line.

More specifically, the second amorphous silicon layer 135a not overlapping with the photoresist pattern PR and the first amorphous silicon layer 130a disposed under the second amorphous silicon layer 135a are removed by dry etching. Due to the nature of the dry etching process, the pattern may be etched to have an area similar to that of the photoresist pattern PR. As such, the semiconductor pattern 130b and the ohmic pattern 135b have a larger area than the second metal layer pattern 146b and the third metal layer pattern 148b. More particularly, the semiconductor pattern 130b and the ohmic pattern 135b protrude from the side surfaces of the second metal layer pattern 146b and the third metal layer pattern 148b, respectively.

Figure 18:
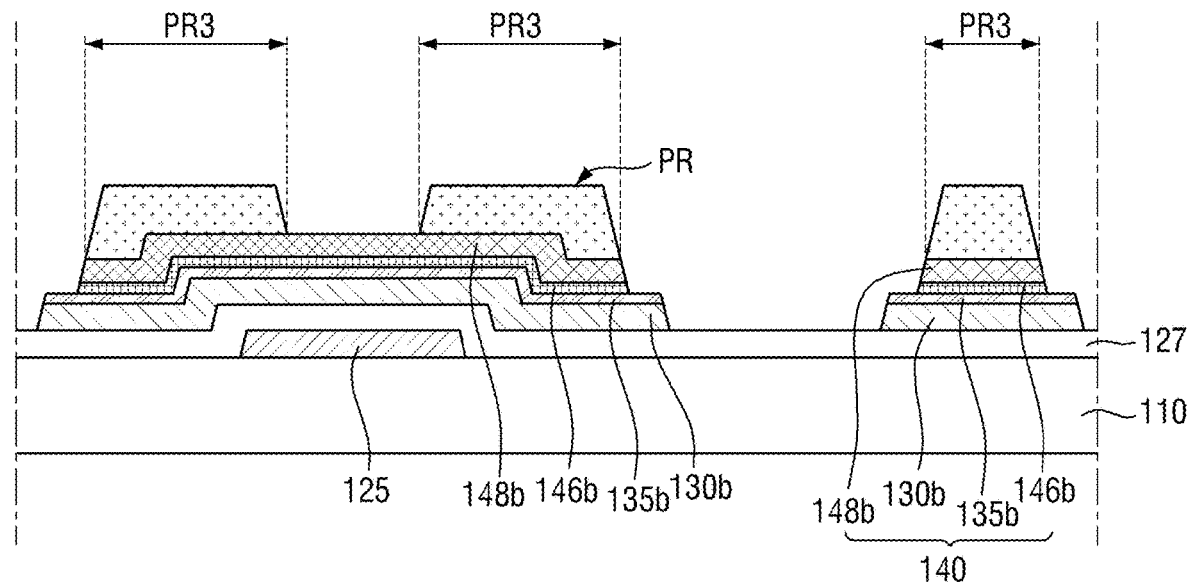

Subsequently, referring to FIG. 18, an ashing process is carried out on the photoresist pattern PR remaining on the substrate 110. Ashing is carried out to reduce the thickness and area of the first photoresist region PR1 and remove the second photoresist region PR2 having the second thickness. Accordingly, after the ashing process, the second photoresist region PR2 having the second thickness is removed, and the thickness of the first photoresist region PR1 is reduced, to form the third photoresist region PR3 having a third thickness. In doing so, the side surface of the third photoresist region PR3 becomes similar to the side surfaces of the second metal layer pattern 146b and the third metal layer pattern 148b disposed thereunder as the thickness and the area of the third photoresist region PR3 are reduced by the ashing. The side surfaces of the semiconductor pattern 130b and the ohmic pattern 135b protrude from the side surfaces of the third photoresist region PR3. In addition, as the second photoresist region PR2 is removed, the third metal layer pattern 148b previously in line with the second photoresist region PR2 is exposed.

Figure 19:
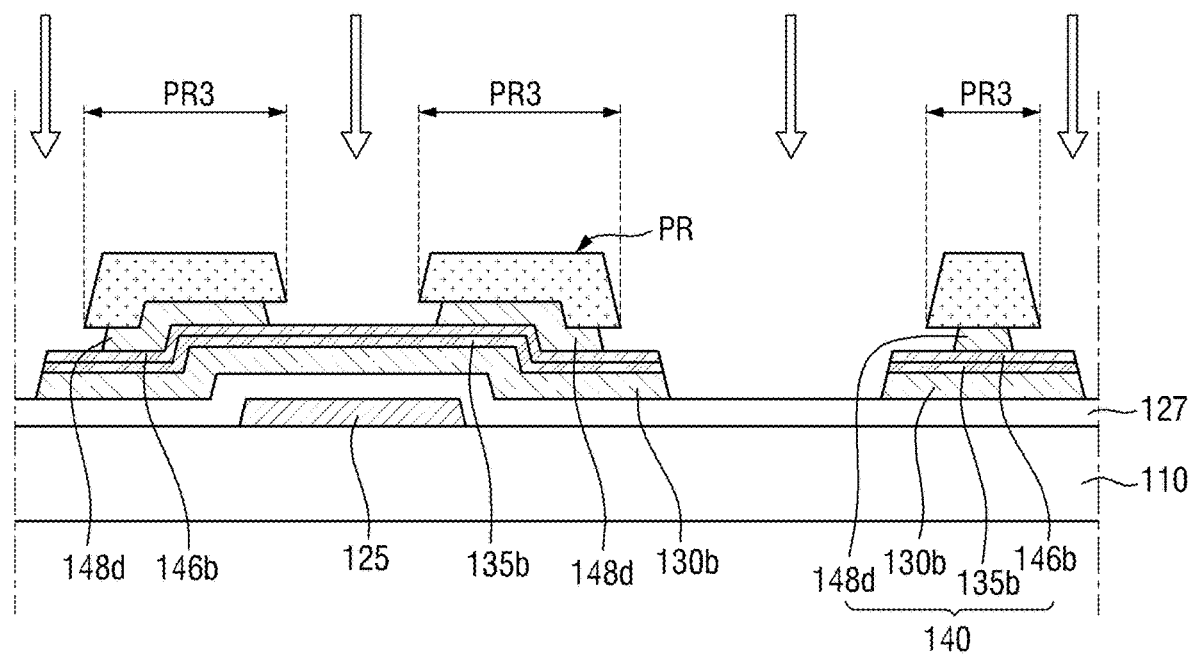

Subsequently, referring to FIG. 19, wet etching is carried out on the substrate 110 on which the photoresist pattern PR including the third photoresist region PR3 is formed, to form a fifth metal layer pattern 148d.

More specifically, the third metal layer pattern 148b not overlapping with the third photoresist region PR3 of the photoresist pattern PR is removed via a wet etching process, so that the fourth metal layer patterns 148d spaced apart from one another is formed. In the process shown in FIG. 11, the second metal layer pattern and the third metal layer pattern are etched simultaneously. However, according to the illustrated exemplary embodiment, only the third metal layer pattern 148b is etched to form the fourth metal layer pattern 148d as shown in FIG. 19. As the etchant for etching the third metal layer pattern 148b, an etchant for a single material is used. Accordingly, the etching rate of the fourth metal layer pattern 148d is increased, so that the length to be undercut into the third photoresist region PR3 is increased.

Figure 20:
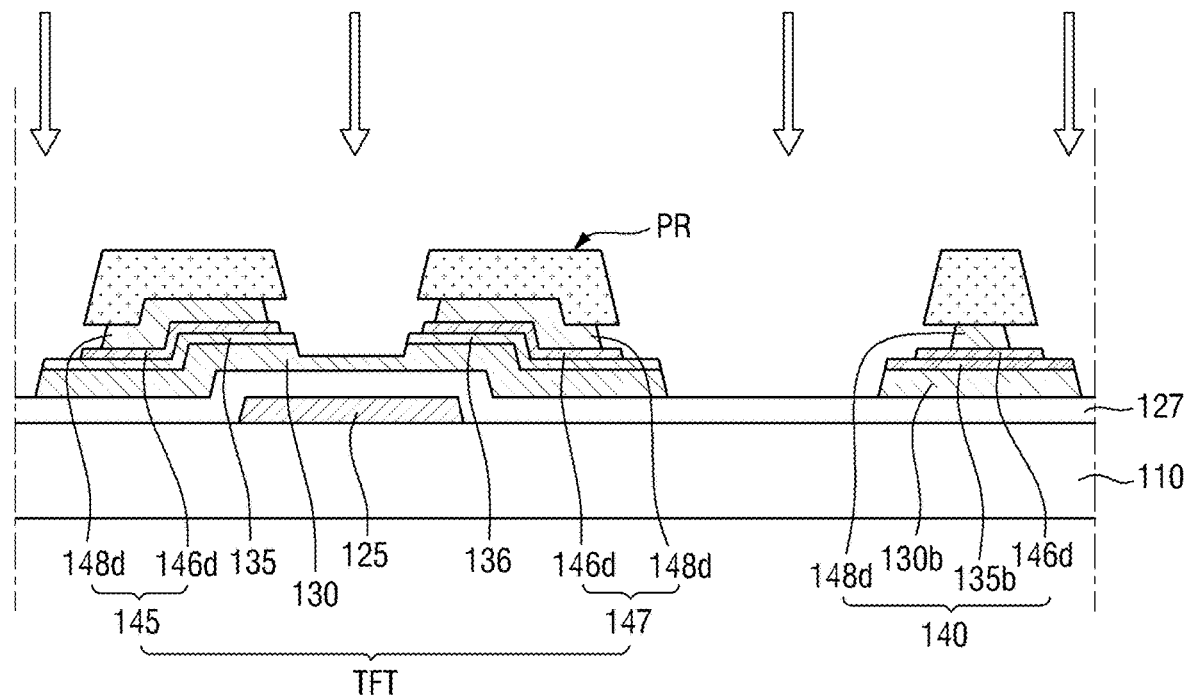

Subsequently, referring to FIG. 20, dry etching is carried out on the substrate 110 on which the photoresist pattern PR including the third photoresist region PR3 is formed, to form a fifth metal layer pattern 146d, ohmic contact layers 135 and 136, and a semiconductor layer 130.

In particular, when the dry etching process is carried out on the substrate 110, the second metal layer pattern 146b and the ohmic pattern 135b not overlapping with the third photoresist region PR3 of the photoresist pattern PR are etched simultaneously. In doing so, the second metal layer pattern 146b is etched faster than the ohmic pattern 135b. As such, the fifth metal layer pattern 146d formed by etching the second metal layer pattern 146b is etched further toward the inner side of the third photoresist region PR3 than the ohmic contact layers 135 and 136 formed by etching the ohmic pattern 135b. In this manner, the ohmic contact layers 135 and 136 are formed to protrude from the fifth metal layer pattern 146d. The semiconductor pattern 130b under the ohmic contact layers 135 and 136 is formed as the semiconductor layer 130.

Accordingly, the source electrode 145 and the drain electrode 147 in which the fifth metal layer pattern 146d and the fourth metal layer pattern 148d are stacked are formed. In addition, the ohmic contact layers 135 and 136 are formed between the source electrode 145 and the semiconductor layer 130 and between the drain electrode 147 and the semiconductor layer 130, respectively. During the above-described dry etching process, a portion of the semiconductor layer 130 is etched, so that a recess is formed in the surface. More particularly, the spacing between the ohmic patterns 135b may function as the channel of the semiconductor layer 130. In addition, the data line 140 including the semiconductor pattern 130b, the ohmic pattern 135b, the fifth metal layer pattern 146d, and the fourth metal layer pattern 148d is fabricated via the dry etching process.

Subsequently, the photoresist pattern PR on the substrate 110 is stripped and removed completely, such that a thin-film transistor TFT including the gate electrode 125, the semiconductor layer 130, the ohmic contact layers 135 and 136, the source electrode 145, and the drain electrode 147 is formed.

Figure 21:
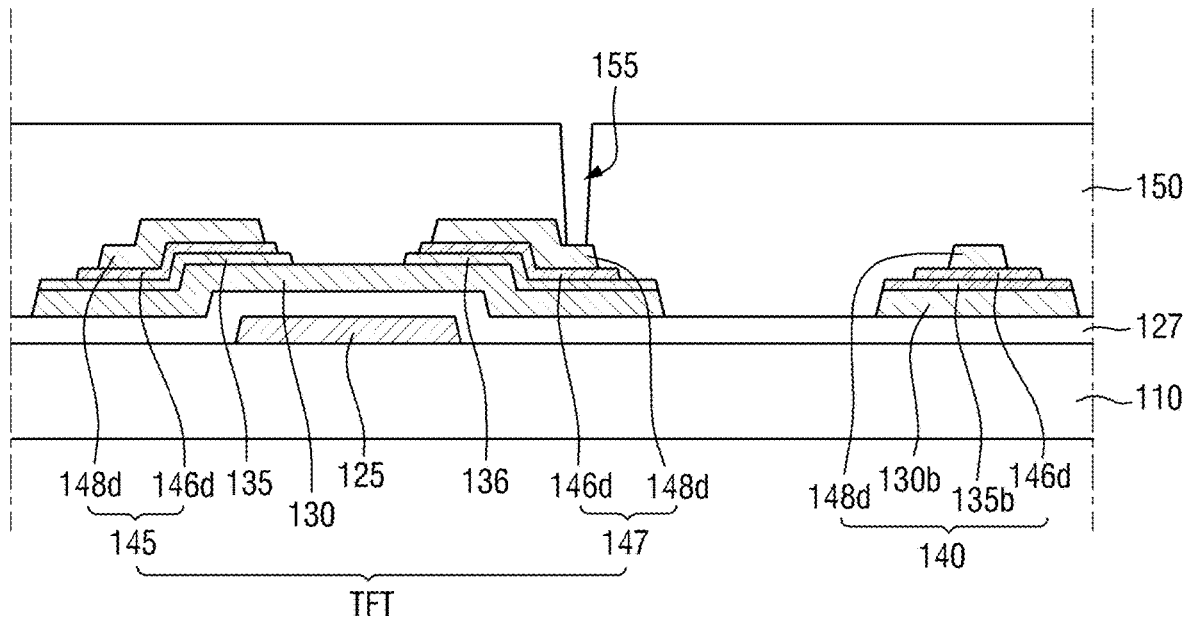

Subsequently, referring to FIG. 21, a passivation layer 150 is formed over the thin film transistor TFT on the substrate 110. A third mask is placed above the passivation layer 150, and patterning is carried out by photolithography to form a via hole 155 exposing the drain electrode 147 of the thin-film transistor TFT.

Figure 22:
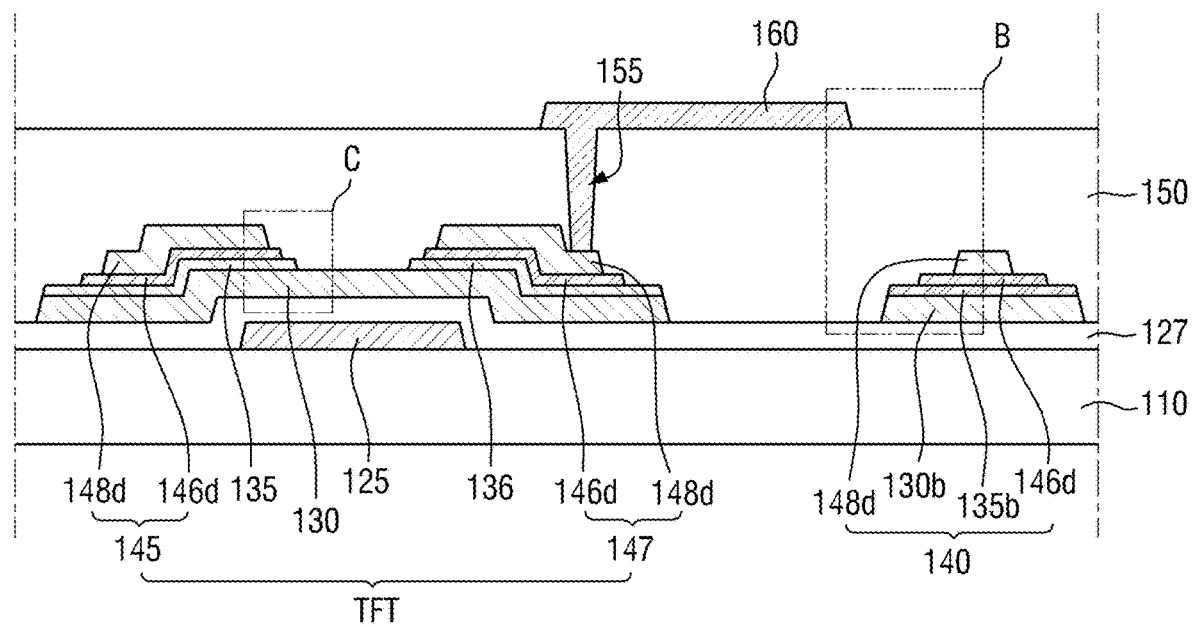

Subsequently, referring to FIG. 22, a pixel electrode 160 is formed on the passivation layer 150. The pixel electrode 160 is formed by depositing a transparent conductive material, such as indium tin oxide (ITO), indium zinc oxide (IZO), and indium tin zinc oxide (ITZO) on the substrate 110, and then patterning the transparent conductive material using a fourth mask. The via hole is filled with the pixel electrode 160, and thus, the pixel electrode 160 is electrically connected to the drain electrode 147. In this manner, the TFT array substrate according to an exemplary embodiment may be fabricated.

In the method of fabricating the TFT array substrate according to an exemplary embodiment described above, the semiconductor layer, the ohmic contact layer, the source electrode, and the drain electrode can be formed using a single mask, and thus, the TFT array substrate can be fabricated using a total of four masks. Accordingly, the fabrication costs from the mask process can be reduced.

Figure 14:
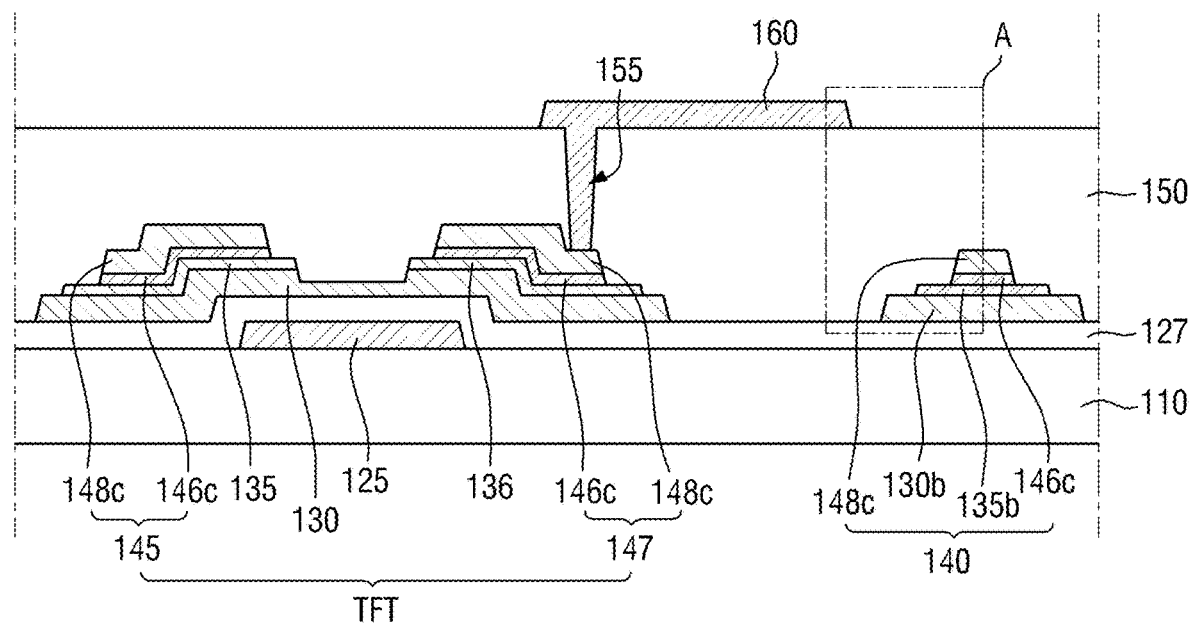
Figure 23:
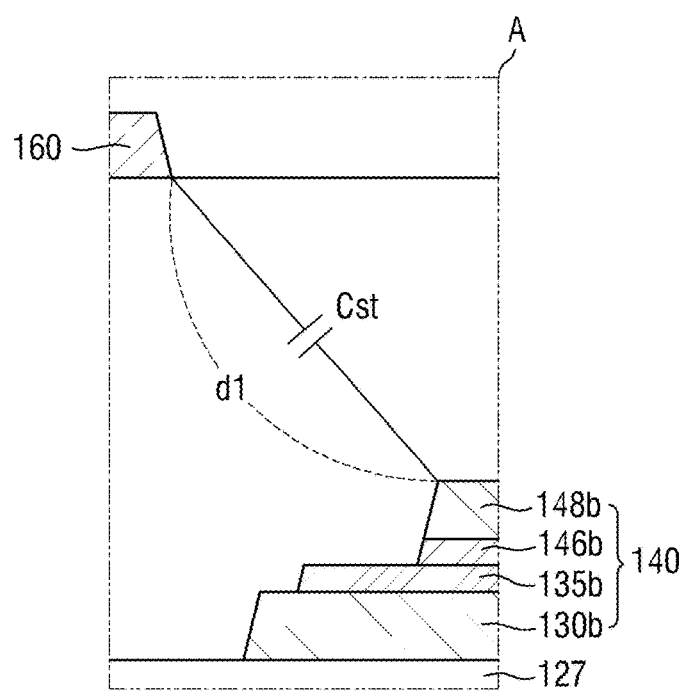
FIG. 23 is an enlarged view of area A shown in FIG. 14.
Figure 24:
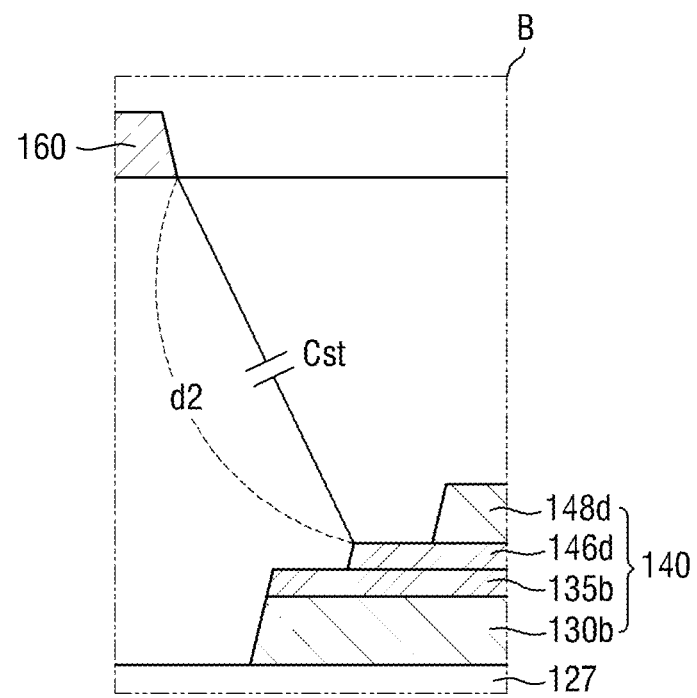
FIG. 24 is an enlarged view of area B of FIG. 22.
Figure 25:
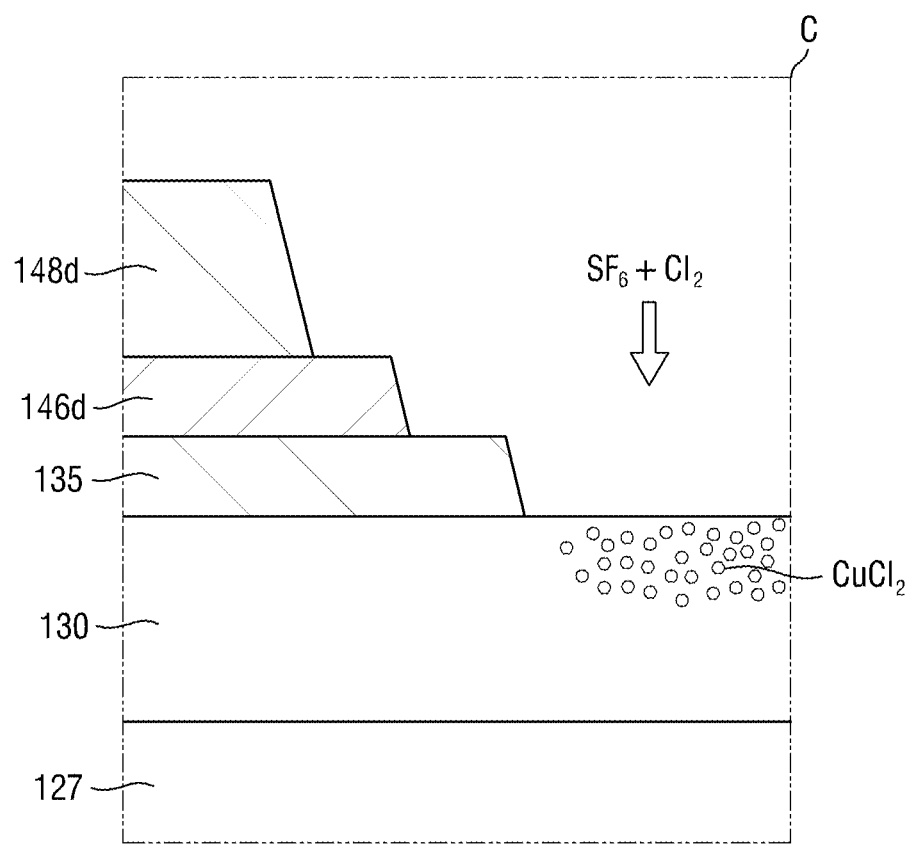
FIG. 25 is an enlarged view of area C of FIG. 22.

FIG. 23 is an enlarged view of area A shown in FIG. 14. FIG. 24 is an enlarged view of area B of FIG. 22. FIG. 25 is an enlarged view of area C of FIG. 22.

Referring to FIG. 23, the data line 140 is formed by stacking the semiconductor pattern 130b, the ohmic pattern 135b, the second metal layer pattern 146b, and the third metal layer pattern 148b. The data line 140 forms a capacitance Cst with the adjacent pixel electrode 160.

The semiconductor pattern 130b and the ohmic pattern 135b are formed of amorphous silicon. When they are irradiated with light, photoelectric current flows therethrough and accordingly, the semiconductor pattern 130b and the ohmic pattern 135b function as a conductor. Otherwise, they work as a semiconductor. The backlight unit disposed under the substrate 110 intermittently emits light when images are displayed, although it looks as if it emits light continuously. When light is emitted from the backlight unit, light is irradiated onto the semiconductor pattern 130b and the ohmic pattern 135b so that they function as a conductor. In this case, the semiconductor pattern 130b and the ohmic pattern 135b lower the resistance of the data line 140 to change the capacitance between the pixel electrode 160 and the data line 140. When no light is emitted, no light is irradiated onto the semiconductor pattern 130b and the ohmic pattern 135b so that they work as a semiconductor. In this case, the semiconductor pattern 130b and the ohmic pattern 135b increase the resistance of the data line 140 to change the capacitance between the pixel electrode 160 and the data line 140. If the capacitance between the pixel electrode 160 and the data line 140 changes repeatedly, Mura may appear in the image. As well known in the art, Mura or Mura defects may be contrast-type defects, in which one or more pixels is brighter or darker than surrounding pixels, when they should have uniform luminance.

In FIG. 23, the distance d1 between the data line 140 and the pixel electrode 160 is relatively long, and accordingly, the capacitance between the data line 140 and the pixel electrode 160 is small. When the resistance of the data line 140 changes, a change in capacitance between the data line 140 and the pixel electrode 160 becomes relatively large, which causes Mura to be more easily recognized.

In FIG. 24, a second metal layer pattern 146d is closer to the pixel electrode 160, so that the distance d2 between the data line 140 and the pixel electrode 160 is relatively short, and accordingly, the capacitance between the data line 140 and the pixel electrode 160 becomes large. In this case, when the resistance of the data line 140 changes, a change in capacitance between the data line 140 and the pixel electrode 160 becomes relatively small, thereby reducing the amount of Mura defects.

In FIGS. 23 and 24, the ohmic pattern 135 and the semiconductor pattern 130b formed of amorphous silicon protrude from the second metal layer pattern 146b and the third metal layer pattern 148b substantially working as the data line 140. The distance between the side surface of the ohmic pattern 135b and the side surface of the second metal layer pattern 146d is relatively large in FIG. 23, whereas the distance between the side surface of the ohmic pattern 135b and the side surface of the second metal layer pattern 146d is relatively short in FIG. 24. As such, there is a difference in the capacitances between the pixel electrode 180 and the data line 140. As described above, when the distance is short as in FIG. 24, the change in capacitance is relatively small, and thus, it is possible to prevent or at least suppress occurrence of Mura defects.

Referring back to FIG. 11, according to an exemplary embodiment, the first electrode pattern 146c and the second electrode pattern 148c forming the source electrode 145, the drain electrode 147, and the data line 140 are etched simultaneously by an etchant containing F$^-$ components. The first electrode pattern 146c may be made of titanium, and the second electrode pattern 148c may be made of copper. As such, copper (Cu) and titanium (Ti) may be simultaneously etched using this etchant. When the etchant includes the F components, the ohmic pattern 135b may also be etched simultaneously. As such, the step of etching the ohmic pattern 135b may be obviated during the dry etching process described above with reference to FIG. 12, and thus, the step using Cl$^-$ gas for etching the ohmic pattern 135b may be omitted.

Referring to FIG. 25, when there are Cl$^-$ components during the dry etching process described above with reference to FIG. 12, Cl$^-$ gas reacts with copper of the fourth metal layer pattern 148d to generate $CuCl_2$, and $CuCl_2$ may be diffused into the channel of the semiconductor layer 130. When $CuCl_2$ is diffused into the channel of the semiconductor layer 130, a current path is formed in the channel. As such, the current at the off-voltage is increased, thereby increasing leakage current. According to an exemplary embodiment, the etching may be carried out without gas during the dry etching process described above with reference to FIG. 12, thereby reducing the leakage current.

As described above, in the method of fabricating the TFT array substrate according to an exemplary embodiment, the change in capacitance between the data line and the pixel electrode may cause Mura defects. In addition, in the method of fabricating the TFT array substrate according to another exemplary embodiment, leakage current may be increased due to diffusion of $CuCl_2$ generated during the dry etching process.

Hereinafter, a method of fabricating a TFT array substrate according to still another exemplary embodiment will be described, by which Mura and leakage current issues can be improved.

FIGS. 26 to 36 are cross-sectional views illustrating processing steps of a method of fabricating a TFT array substrate according to another exemplary embodiment.

Figure 26:
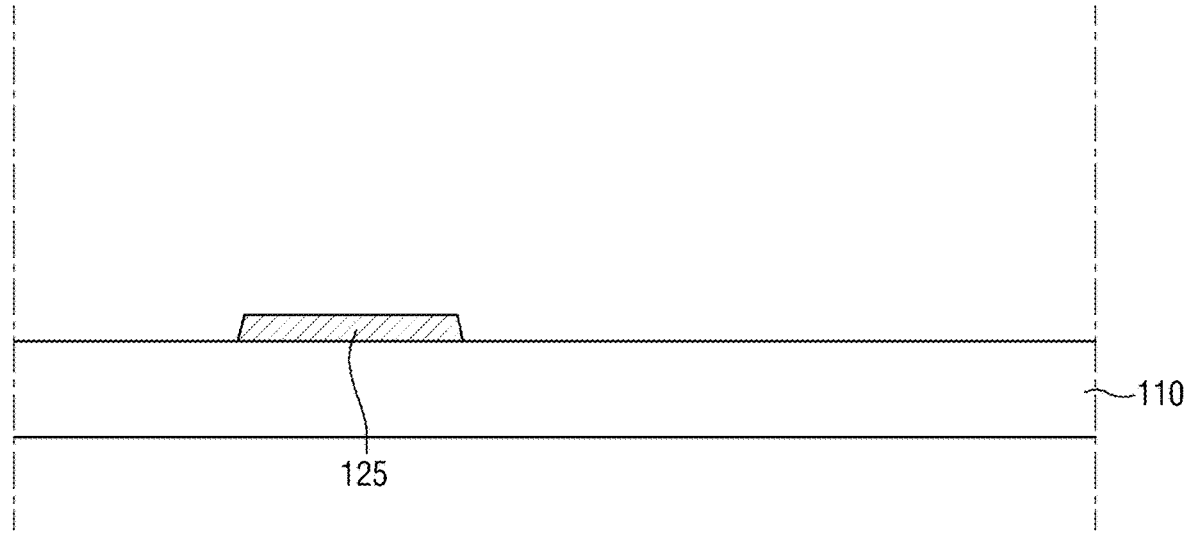
FIGS. 26, 27, 28, 29, 30, 31, 32, 33, 34, 35, and 36 are cross-sectional views illustrating processing steps of a method of fabricating a thin-film transistor array substrate according to another exemplary embodiment.

Referring to FIG. 26, a first metal material is disposed on a substrate 110 to form a first metal layer, and then the first metal layer is patterned by performing photolithography using a photoresist, so that a gate electrode 125 is formed.

More specifically, a first metal material selected from the group consisting of: molybdenum (Mo), aluminum (Al), chromium (Cr), gold (Au), titanium (Ti), nickel (Ni), neodymium (Nd), and copper (Cu) is disposed on the substrate 110 to form a first metal layer. Subsequently, a photoresist layer is formed on the entire surface of the first metal layer by coating a photoresist, such as spin coating. A first mask is placed above the photoresist layer, and then an exposure process of irradiating ultra violet (UV) is carried out. A developing solution is applied onto parts of the photoresist layer exposed to the UV, and the exposed parts are removed via a developing process, such that a photoresist pattern is formed.

Subsequently, the first metal layer not overlapping with the photoresist pattern is subjected to wet etching with an etchant, so that the gate electrode 125 is formed. Then, the photoresist pattern remaining on the gate electrode 125 is stripped and removed, so that the gate electrode 125 is formed by using the photolithography. In doing so, the gate electrode 125 formed on the substrate 110 may be formed to have a single layer or two or more layers using the above-described first metal material. In the drawings, the gate electrode 125 is exemplarily shown as having a single layer structure.

Figure 27:
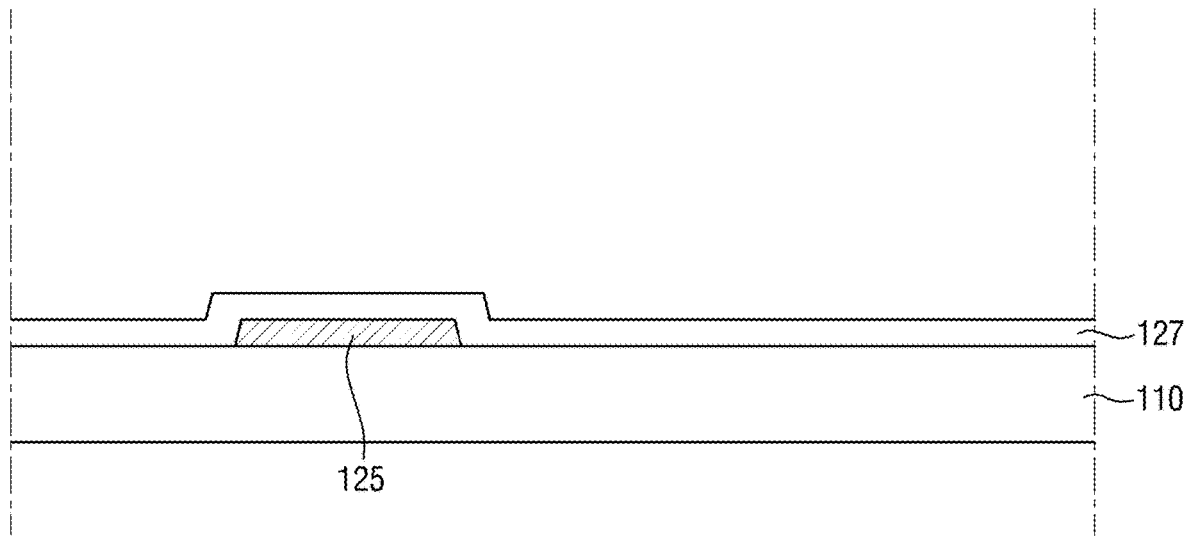

Subsequently, referring to FIG. 27, a gate insulating layer 127 is formed over the gate electrode 125 on the substrate 110. The gate insulating layer 127 electrically isolates the gate electrode 125, and may be made up of a single layer or multiple layers of silicon oxide ($SiO_x$), silicon nitride ($SiN_x$), or silicon oxynitride ($SiO_xN_y$).

Figure 28:
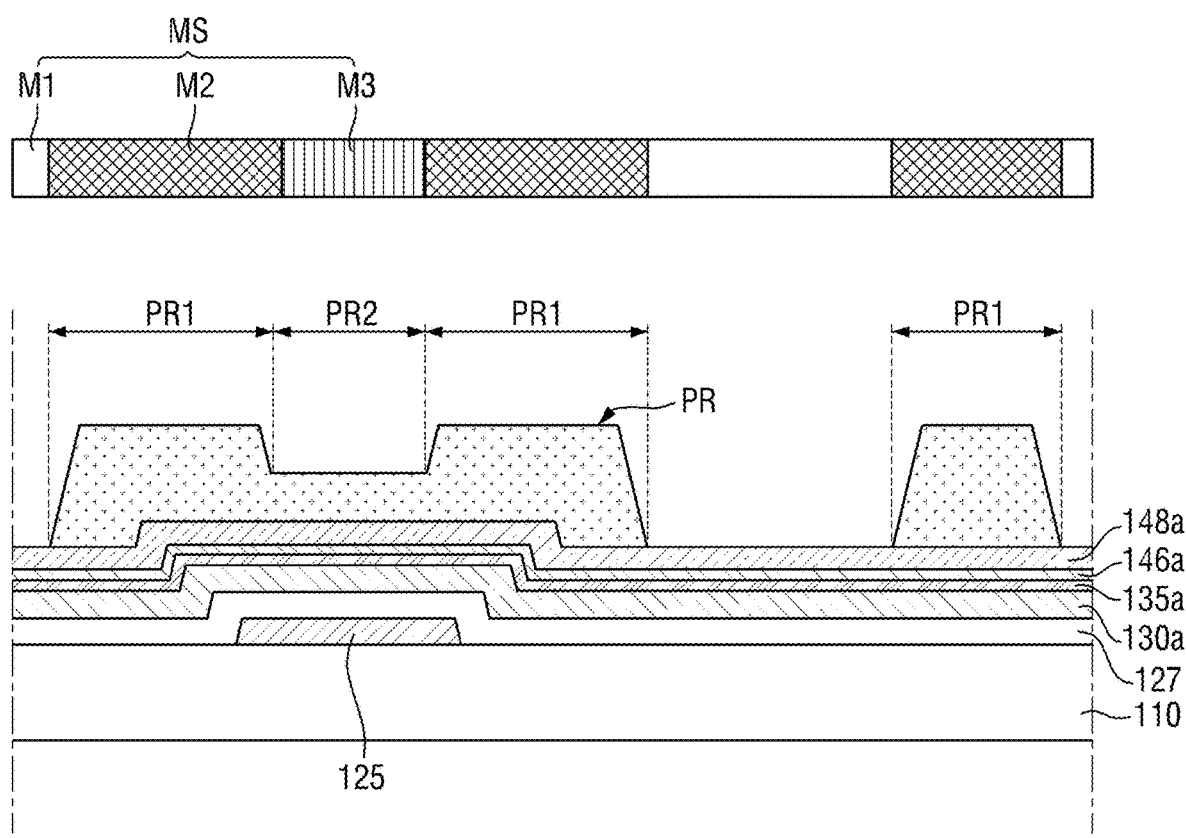

Subsequently, referring to FIG. 28, pure amorphous silicon (a-Si) and impurity amorphous silicon (n+a-Si) are sequentially deposited on the gate insulating layer 127 to form a first amorphous silicon layer 130a and a second amorphous silicon layer 135a. Subsequently, a second metal material is deposited on the second amorphous silicon layer 135a to form a second metal layer 146a, and a third metal material is deposited on the second metal layer 146a to form a third metal layer 148a.

Each of the second metal layer 146a and the third metal layer 148a may be made of one selected from the group consisting of: molybdenum (Mo), aluminum (Al), chromium (Cr), gold (Au), titanium (Ti), nickel (Ni), neodymium (Nd), and copper (Cu). According to the illustrated exemplary embodiment, the second metal layer 146a may include titanium (Ti), and the third metal layer 148a may include copper (Cu).

Subsequently, a photoresist layer is formed on the third metal layer 148a by coating a photoresist, such as spin coating. Subsequently, the photoresist pattern PR is formed by exposing and developing processes using a second mask.

More particularly, a second mask MS, which is a half-tone mask, is placed above a photoresist layer. The second mask includes a transmissive region M1 through which light is transmitted, a non-transmissive region M2 through which light is blocked, and a transflective region M3 through which the amount of light is adjusted. Subsequently, an exposure process of irradiating UV toward the substrate 110 from above the second mask MS is carried out. The second mask MS is placed to align the non-transmissive region M2 with regions where the semiconductor layer, the source electrode, the drain electrode, and the data line are to be formed, the transflective region M3 with regions where the spacing between the source electrode and the drain electrode is to be formed, and the transmissive region M1 with the remaining regions. Accordingly, the region in line with the non-transmissive region M2 where the semiconductor layer, the source electrode, the drain electrode, and the data line are to be formed is not irradiated with UV, the remaining region in line with the transmissive region M1 is irradiated with UV, and the region between the source electrode and the drain electrode in line with the transflective region M3 is irradiated with an adjusted amount of UV.

Subsequently, a developing solution is applied onto the exposed photoresist layer to perform a developing process, such that a photoresist pattern PR is formed. According to the developing process, a first photoresist region PR1 having a first thickness is formed in the regions of the third metal layer 148a where the source electrode, the drain electrode, and the data line are to be formed, and a second photoresist region PR2 having a second thickness less than the first thickness is formed in the regions where the spacing between the source electrode and the drain electrode is to be formed. In the remaining regions, the photoresist layer is completely removed so that the third metal layer 148a is exposed.

Figure 29:
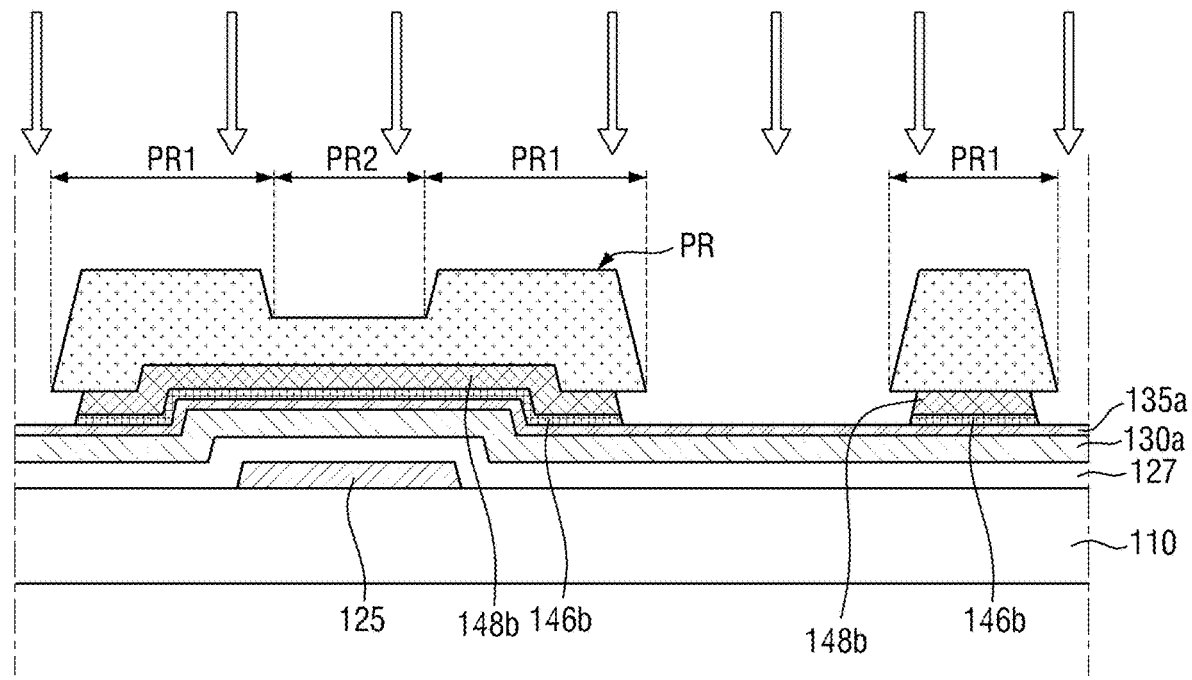

Subsequently, referring to FIG. 29, a wet etching process is carried out on the substrate 110 using an etchant, so that the second metal layer 146a and the third metal layer 148a not overlapping with the first photoresist region PR1 and the second photoresist region PR2 of the photoresist pattern PR are removed. In this manner, the second metal layer pattern 146b and the third metal layer pattern 148b where the source electrode, the drain electrode, and the data line are to be formed are formed in regions in line with the first photoresist region PR1 and the second photoresist region PR2.

The etchant for etching the second metal layer 146a and the third metal layer 148a is capable of etching the second metal layer 146a together with the third metal layer 148a. In addition, due to the nature of the wet etching process, the second metal layer pattern 146b and the third metal layer pattern 148b are overly etched to have an undercut in the first photoresist region PR1 and the second photoresist region PR2.

Figure 30:
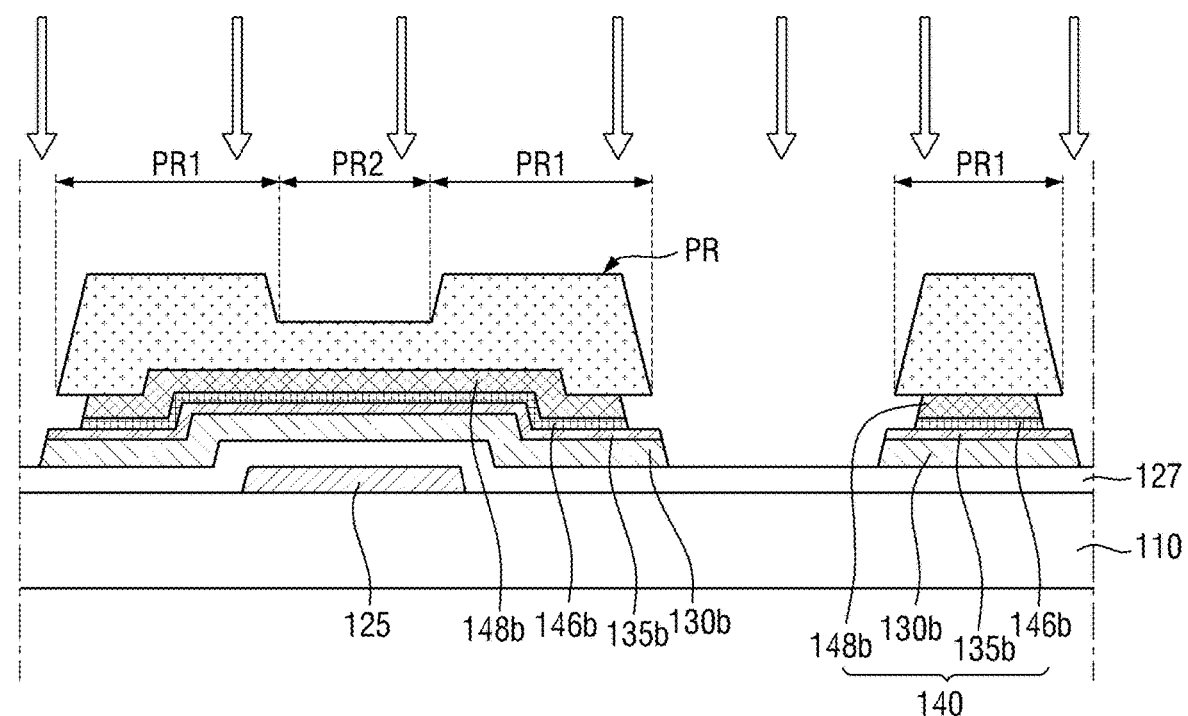

Subsequently, referring to FIG. 30, dry etching is carried out on the second amorphous silicon layer 135a not overlapping the first photoresist region PR1 and the second photoresist region PR2 of the photoresist pattern PR. As such, the semiconductor pattern 130b to be formed as the semiconductor layer and the data line, and the ohmic pattern 135b to be formed as the ohmic contact layer and the data line, may be formed.

More particularly, the second amorphous silicon layer 135a not overlapping with the photoresist pattern PR and the first amorphous silicon layer 130a disposed under the second amorphous silicon layer 135a are removed by dry etching. Due to the nature of the dry etching process, the pattern may be etched to have an area similar to that of the photoresist pattern PR. As such, the semiconductor pattern 130b and the ohmic pattern 135b have a larger area than the second metal layer pattern 146b and the third metal layer pattern 148b. More particularly, the semiconductor pattern 130b and the ohmic pattern 135b protrude from the side surfaces of the second metal layer pattern 146b and the third metal layer pattern 148b, respectively.

In addition, the data line 140 including the semiconductor pattern 130b, the ohmic pattern 135b, the second metal layer pattern 146b, and the third metal layer pattern 148b is fabricated via the dry etching process.

Figure 31:
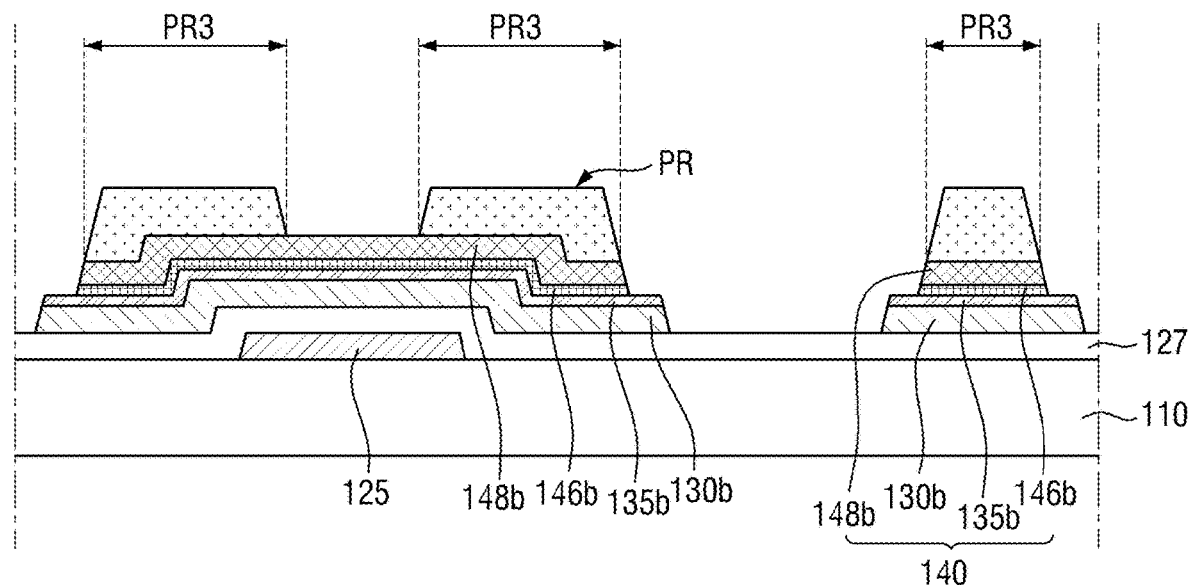

Subsequently, referring to FIG. 31, an ashing process is carried out on the photoresist pattern PR remaining on the substrate 110. Ashing is carried out to reduce the thickness and area of the first photoresist region PR1 and remove the second photoresist region PR2 having the second thickness. Accordingly, after the ashing process, the second photoresist region PR2 having the second thickness is removed, and the thickness of the first photoresist region PR1 is reduced, to form the third photoresist region PR3 having a third thickness. In doing so, the side surface of the third photoresist region PR3 becomes similar to the side surfaces of the second metal layer pattern 146b and the third metal layer pattern 148b disposed thereunder as the thickness and the area of the third photoresist region PR3 are reduced by the ashing. The side surfaces of the semiconductor pattern 130b and the ohmic pattern 135b protrude from the side surfaces of the third photoresist region PR3. In addition, as the second photoresist region PR2 is removed, the third metal layer pattern 148b previously in line with the second photoresist region PR2 is exposed.

Figure 32:
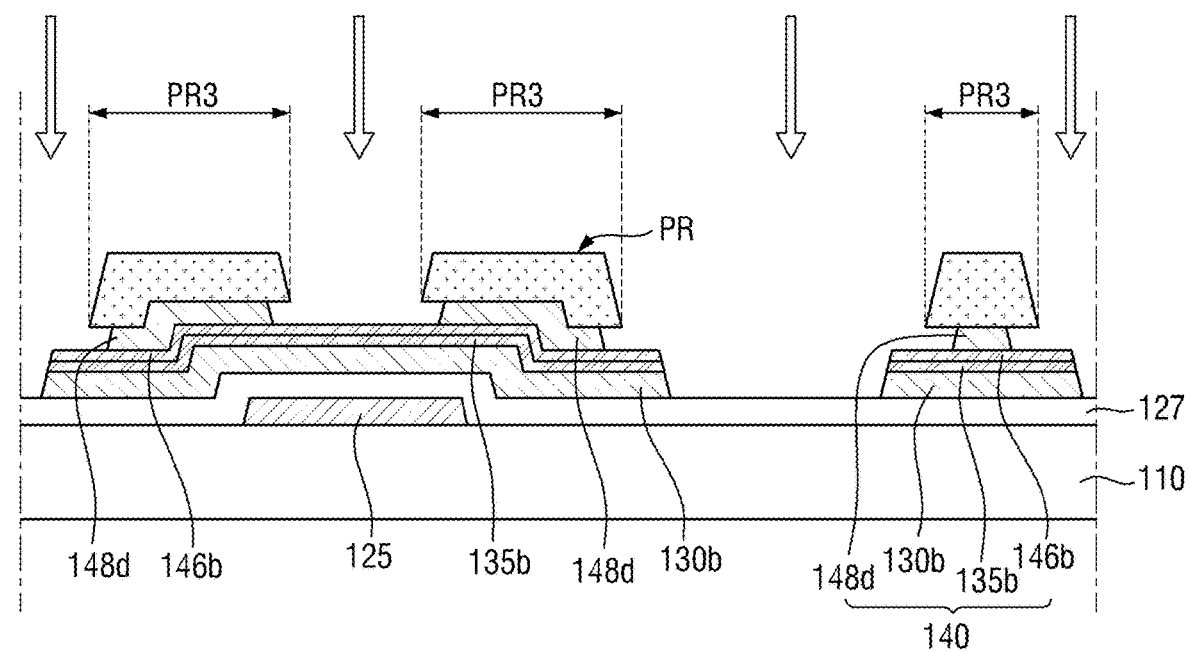

Referring to FIG. 32, wet etching is carried out on the substrate 110 on which the photoresist pattern PR including the third photoresist region PR3 is formed, to form a fifth metal layer pattern 148d.

More particularly, the third metal layer pattern 148b not overlapping with the third photoresist region PR3 of the photoresist pattern PR is removed via a wet etching process, so that the fourth metal layer patterns 148d spaced apart from one another is formed. In the process shown in FIG. 11, the second metal layer pattern and the third metal layer pattern are etched simultaneously. However, according to the illustrated exemplary embodiment, only the third metal layer pattern 148b is etched to form the fourth metal layer pattern 148d. As the etchant for etching the third metal layer pattern 148b, an etchant for a single material is used. Accordingly, the etching rate of the fourth metal layer pattern 148d is increased, so that the length to be undercut into the third photoresist region PR3 is increased.

Subsequently, referring to FIG. 33, a polishing process is carried out on the substrate 110 on which the photoresist pattern PR including the third photoresist region PR3 is formed, to form a fifth metal layer pattern 146d. During the polishing process, a polishing apparatus that performs a chemical mechanical polishing (CMP) process may be used.

In a CMP polishing process, polishing slurry is adsorbed on the surface of the substrate, and then a portion of the surface is peeled off when the slurry is separated due to liquidity. As such, when the electrical characteristics of the surface of the substrate and the polishing slurry are opposite to each other at a certain acidity of the polishing slurry, attractive force is generated, so that polishing is easily performed and the removal rate (RR) is increased. By using such characteristics, it is possible to achieve a self-stop process, i.e., a layer to be polished is etched out while no etching is carried out on a layer not to be polished based on the different polarities.

A polishing apparatus PD includes a polishing part PL where a polishing pad PP is mounted. The polishing apparatus PD polishes a workpiece by rotating or linearly reciprocating of the polishing part PL. In doing so, the polishing slurry SL is supplied between the polishing pad PP and the substrate 110 through a nozzle or the like.

In FIG. 32, a target to be polished is the second metal layer pattern 146b that does not overlap with the photoresist pattern PR. More particularly, the polishing slurry SL is applied onto the substrate 110 where the photoresist pattern PR is formed, and the second metal layer pattern 146d is polished using the polishing apparatus PD, so that the fifth metal layer pattern 146d is formed, as shown in FIG. 33.

Metal has a positive polarity at all pH values, while the photoresist or organic layer has a negative polarity at basic ranges. Therefore, when the negative polishing slurry SL including a basic dispersant is used, the second metal layer pattern 146b having the opposite polarity is etched by polishing while the photoresist pattern PR having the same polarity is not etched. Since the polishing slurry SL may be formed in a paste phase to partially penetrate into the photoresist pattern PR, the fifth metal layer pattern 146d may have a shape that is recessed inwardly from the side surfaces of the photoresist pattern PR. Accordingly, the source electrode 145 where the fifth metal layer pattern 146d is stacked and the drain electrode 147 where the fourth metal layer pattern 148d is stacked are formed.

Figure 34:
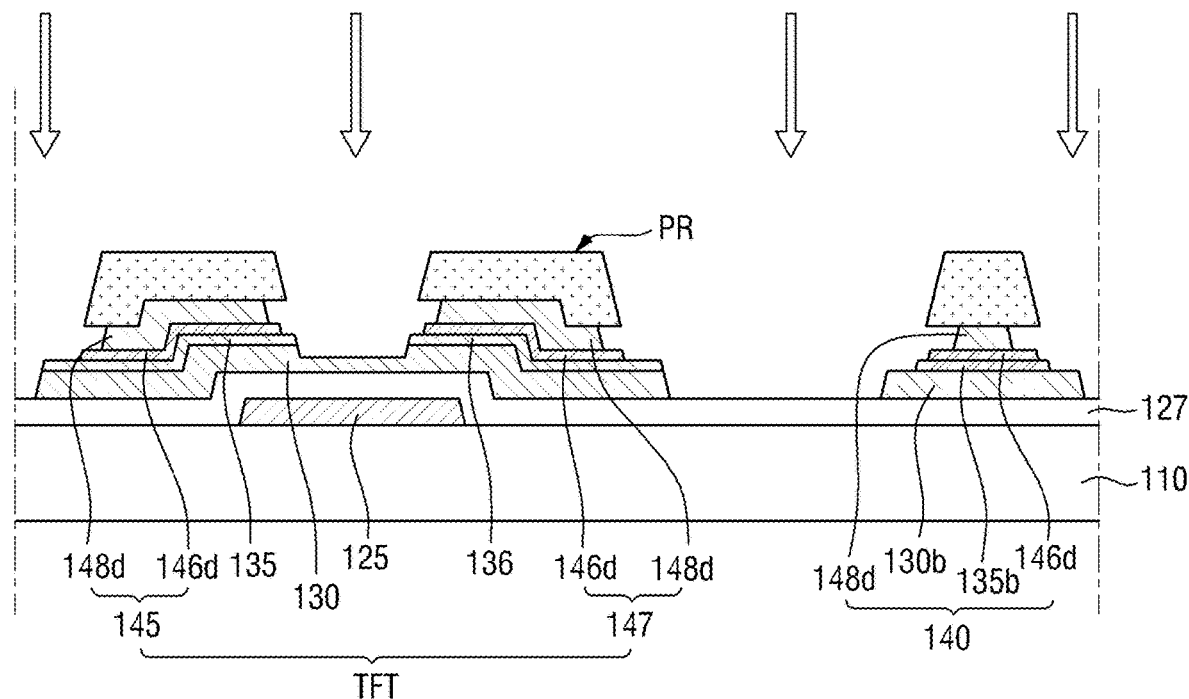

Subsequently, referring to FIG. 34, dry etching is carried out on the substrate 110 where the photoresist pattern PR is formed, so that the ohmic contact layers 135 and 136 and the semiconductor layer 130 are formed.

More particularly, when the dry etching process is carried out on the substrate 110, the photoresist pattern PR functions as a mask so that the ohmic pattern 135*b* not overlapping with the photoresist pattern PR is etched, and accordingly the ohmic contact layers 135 and 136 spaced apart from each other are formed. The semiconductor pattern 130*b* under the ohmic contact layers 135 and 136 is formed as the semiconductor layer 130. As such, the ohmic contact layers 135 and 136 are formed between the source electrode 145 and the semiconductor layer 130 and between the drain electrode 147 and the semiconductor layer 130, respectively.

During the above-described dry etching process, a portion of the semiconductor layer 130 is etched, so that a recess is formed in the surface. More particularly, the spacing between the ohmic contact layers 135 and 136 functions as the channel of the semiconductor layer 130. In addition, the data line 140 including the semiconductor pattern 130*b*, the ohmic pattern 135*b*, the fifth metal layer pattern 146*d*, and the fourth metal layer pattern 148*d* is formed via the dry etching process.

Subsequently, the photoresist pattern PR on the substrate 110 is stripped and removed completely, such that a thin-film transistor TFT including the gate electrode 125, the semiconductor layer 130, the ohmic contact layers 135 and 136, the source electrode 145, and the drain electrode 147 is formed.

Figure 35:
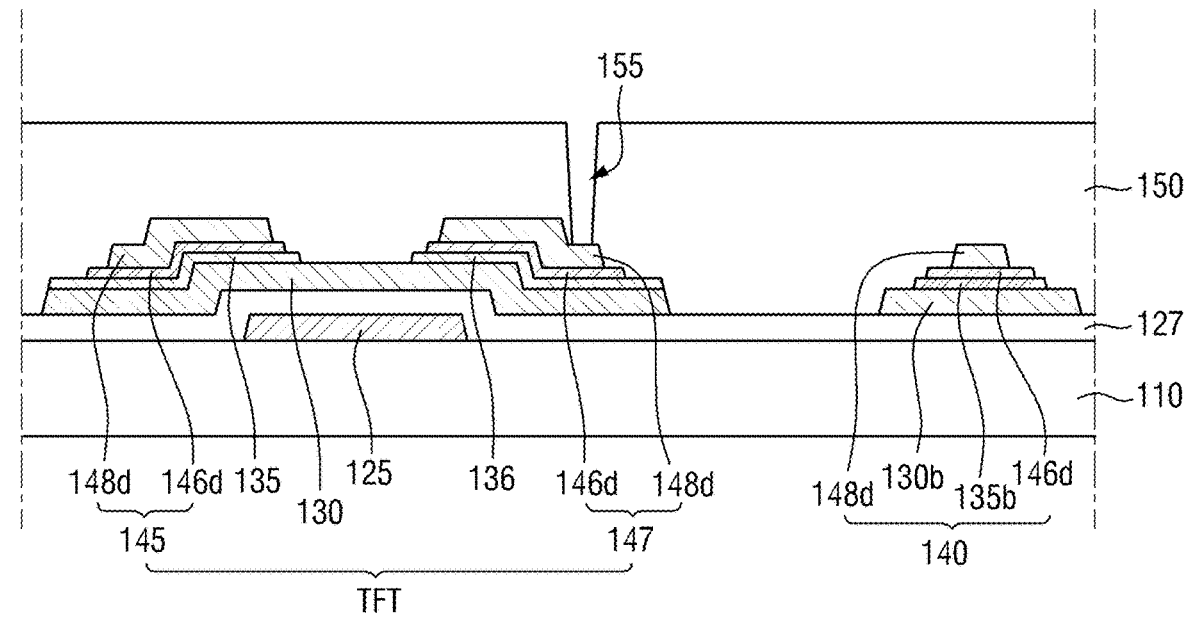

Subsequently, referring to FIG. 35, a passivation layer 150 is formed over the thin-film transistor TFT on the substrate 110. A third mask is placed above the passivation layer 150, and patterning is carried out by photolithography to form a via hole 155 exposing the drain electrode 147 of the thin-film transistor TFT.

Figure 36:
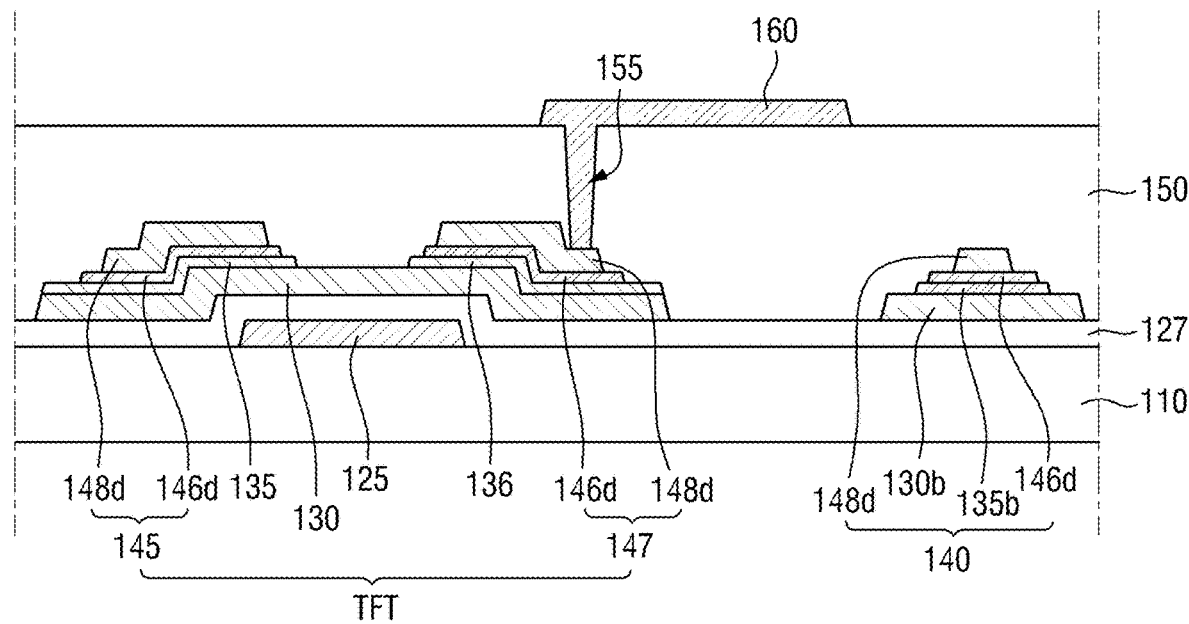

Subsequently, referring to FIG. 36, a pixel electrode 160 is formed on the passivation layer 150. The pixel electrode 160 is formed by depositing a transparent conductive material, such as indium tin oxide (ITO), indium zinc oxide (IZO), and indium tin zinc oxide (ITZO) on the substrate 110, and then patterning the transparent conductive material using a fourth mask. The via hole is filled with the pixel electrode 160, and thus, the pixel electrode 160 is electrically connected to the drain electrode 147. In this manner, the TFT array substrate according to an exemplary embodiment may be fabricated.

Figure 37:
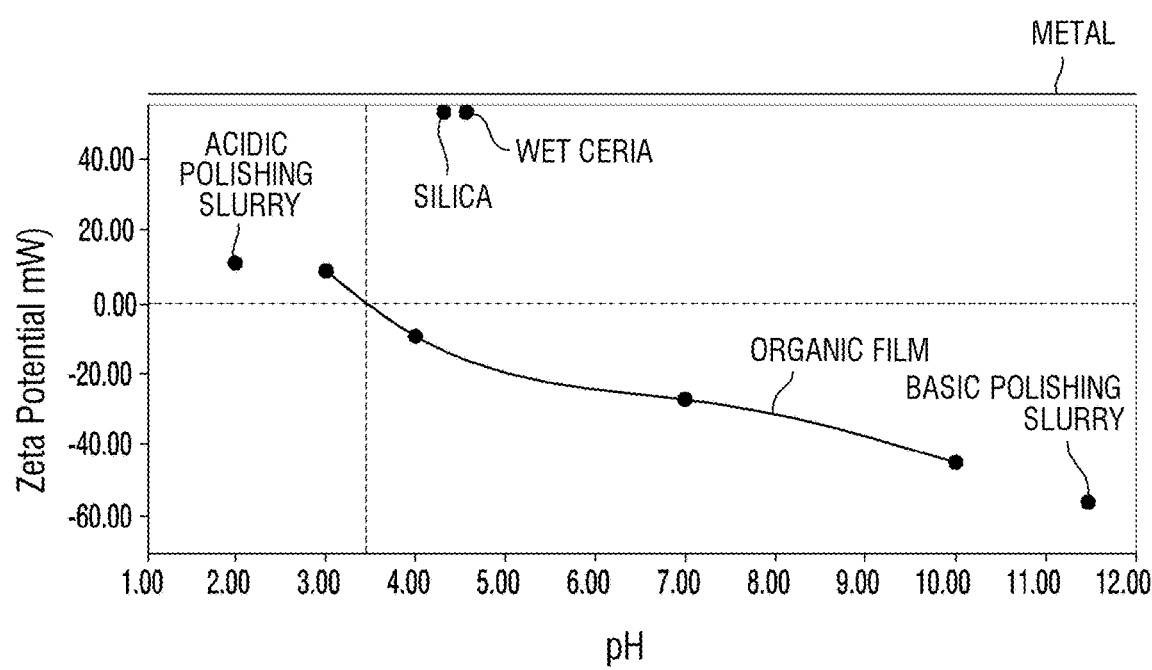
FIG. 37 is a graph showing zeta potential versus acidity (pH) of an organic layer.

FIG. 37 is a graph showing zeta potential versus acidity (pH) of an organic layer.

It can be seen from the graph of FIG. 37 that metal has a zeta potential of a positive polarity at all pH values, while the organic layer has a negative polarity at basic ranges. Using such characteristics, according to another exemplary embodiment, a negative polishing slurry containing a basic dispersant is used, so that the second metal layer pattern of the opposite polarity is etched by polishing, whereas the photoresist pattern of the same polarity is not etched.

In the method of fabricating a TFT array substrate according to the illustrated exemplary embodiment, the second metal layer pattern is etched via the polishing process utilizing the above-described characteristics, and thus, it is possible to prevent leakage current from being generated by $CuCl_2$ during dry etching, which may possibly occur in the manufacturing method illustrated with reference to FIGS. 15-22.

Figure 11:
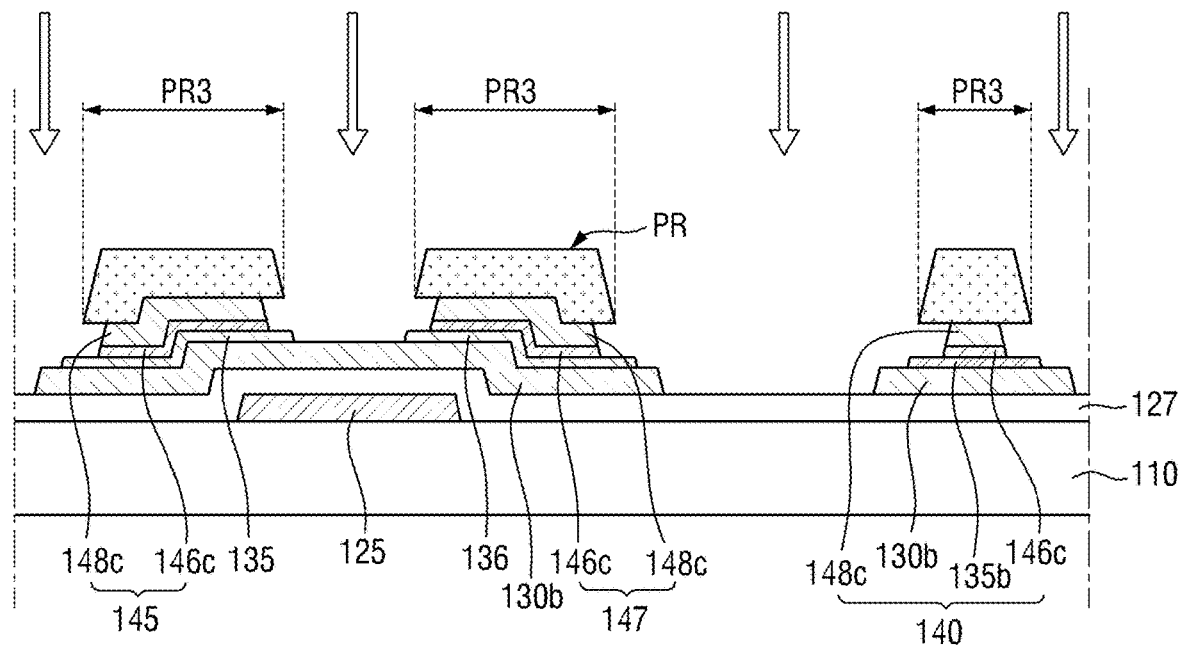

In addition, in the method of fabricating a TFT array substrate according to the illustrated exemplary embodiment, the wet etching process for etching the second metal layer pattern shown in FIG. 11 is replaced with the polishing process, thus, it is possible to prevent or at least suppress Mura from occurring in images.

Hereinafter, the polishing process used in the above-described exemplary embodiment will be described.

The polishing process according to an exemplary embodiment may be used to etch the second metal layer pattern by adjusting the polishing slurry, the polishing pad, the acidity (pH) of the polishing slurry and the polishing pressure.

The polishing slurry may include polishing particles, a dispersant, a pH adjuster.

The polishing particles may include metal oxides, such as dry ceria, wet ceria, silica, alumina, zirconia, and titania. One of the above-listed materials or a combination of two or more kinds may be used as the polishing particles.

In an exemplary embodiment, the polishing process is employed to polish the second metal layer pattern, which may include titanium. Since titanium has a zeta potential greater than zero at all pH values, one of the metal oxides that has a zeta potential smaller than zero at pH 4.5 or higher may be used.

In an exemplary embodiment, the polishing particles may be silica.

Figure 38:
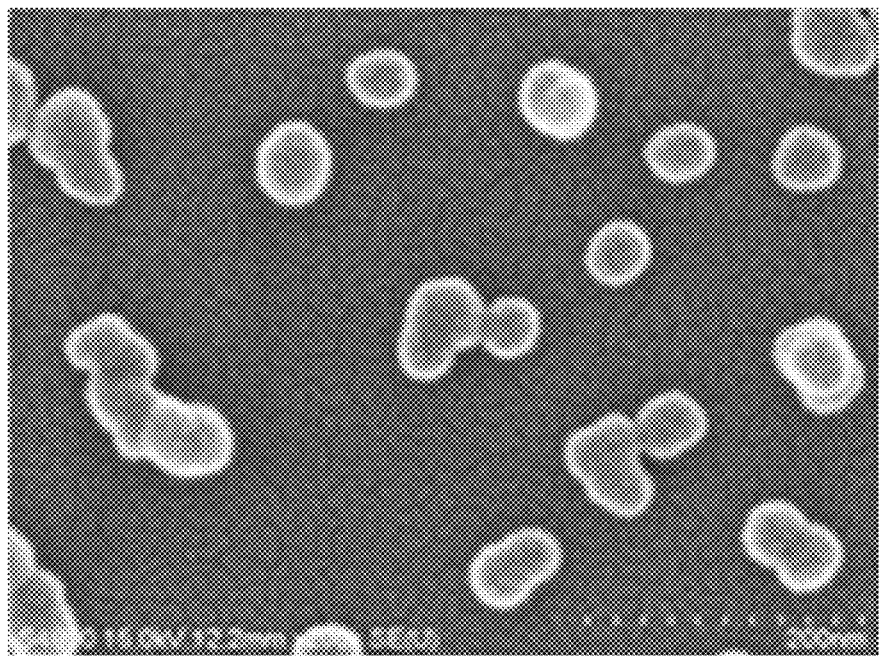
FIGS. 38, 39, 40, and 41 are images showing a variety of forms of silica particles.
Figure 39:
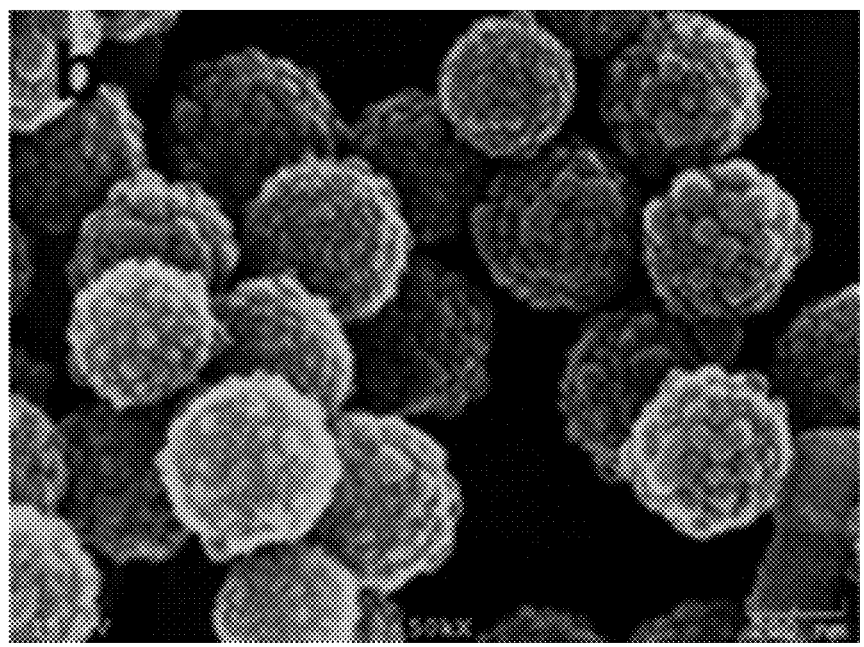
Figure 40:
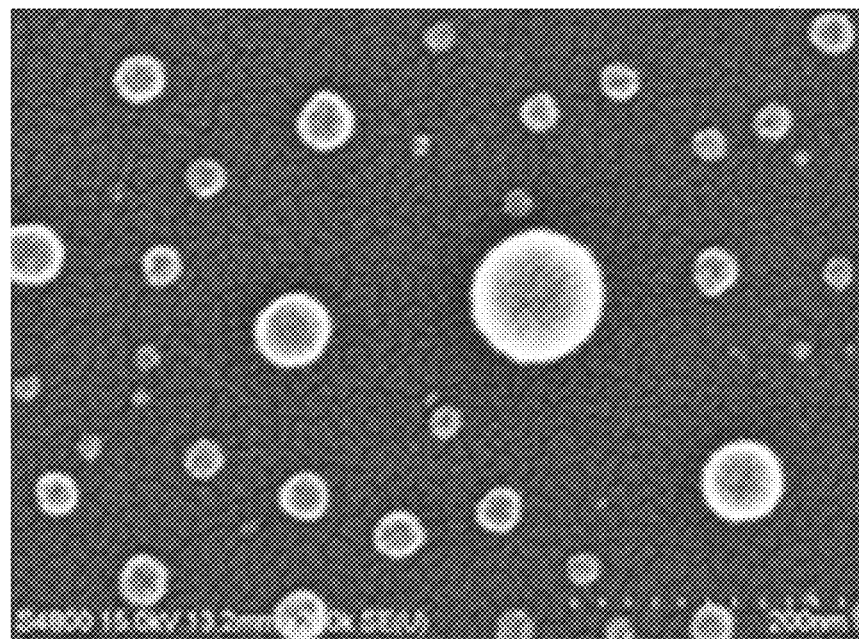
Figure 41:
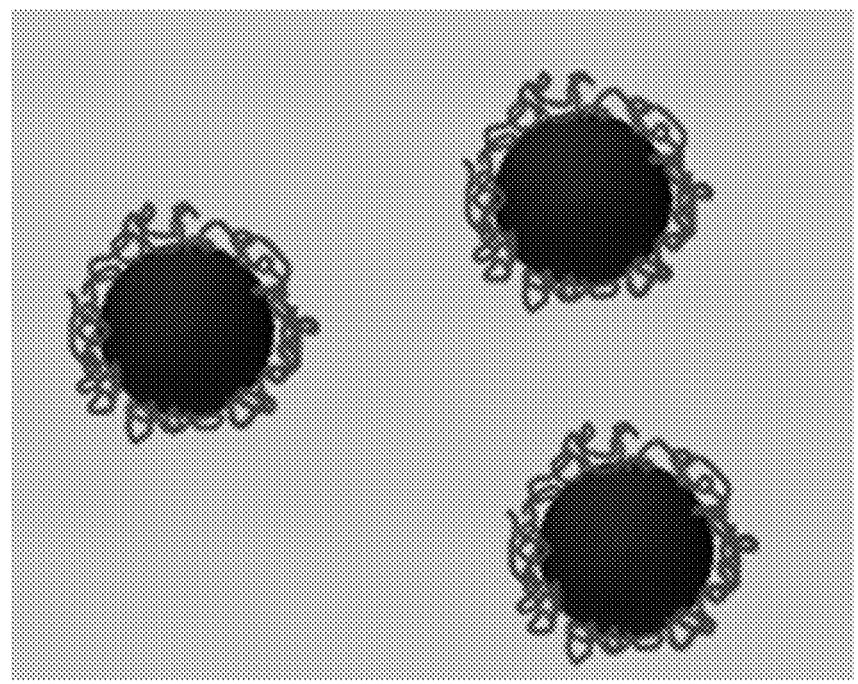

FIGS. 38 to 41 are images showing a variety of forms of silica particles. The form of silica particles may have a cocoon shape as shown in FIG. 38, a polymer core surrounded by a silica shell as shown in FIG. 39, a sphere shape as shown in FIG. 40, or a silica particle surrounded by a polymer as shown in FIG. 41.

The average particle diameter of the polishing particles may range from 0.1 µm to 5 µm. More specifically, the average particle diameter of the polishing particles may range from 0.8 µm to 3 µm. If the average particle diameter of polishing particles is 0.1 µm or more, a workpiece can be easily polished, and the surface uniformity of the workpiece can be improved. If the average particle diameter of the polishing particles is 5 µm or less, it is possible to prevent the workpiece from being polished too much or scratches on the surface of the workpiece.

The content of the polishing particles may range from 0.1% to 10% by weight relative to 100% by weight of the total polishing slurry. If the content of the polishing particles is 0.1% by weight or more relative to 100% by weight of the total polishing slurry, the polishing rate for the workpiece may be adjusted. If the content of the polishing particles is 10% by weight or less relative to 100% by weight of the total polishing slurry, it is possible to prevent the workpiece from being polished too much or scratches on the surface of the workpiece.

The dispersant serves to prevent agglomeration of the polishing particles in the polishing slurry and to uniformly disperse the polishing particles. The dispersants may contain materials that can convert the surface potential of the polishing particles into negative. The dispersant may include, for example, one or more kinds selected from anionic polymers, cationic polymers, hydroxyl acids, and amino acids.

The anionic polymers may be one or more selected from the group consisting of: oxalic acid, citric acid, polysulphonic acid, polyacrylic acid, polymethacrylic acid, a copolymer, or a salt thereof.

The cationic polymers may be one or more selected from the group consisting of: polylysine, polyethyleneimine, benzethonium chloride, bronidox, cetrimonium bromide, cetrimonium chloride, dimethyl dioctadecyl ammonium chloride, tetramethyl ammonium hydroxide, distearyl dimethyl ammonium chloride, poly(dimethylamine-co-epichlorohydrin), 1,2-dioleoyl-3-trimethylammonium propane, and poly(allyl amine).

The hydroxyl acids may be one or more selected from hydroxybenzoic acid, ascorbic acid, and a salt thereof.

The amino acids may be one or more selected from picolinic acid, glutamic acid, tryptophane, aminobutyric acid, or a salt thereof.

One of the above-listed materials or a combination of two or more kinds may be used as the dispersant. In an exemplary embodiment, an anionic polymer may be used as the dispersant. Since the anionic polymer has a high zeta potential, it is possible to effectively disperse the polishing particles at low concentration.

The content of the dispersant may range from 0.001% to 0.1% by weight relative to 100% by weight of the total polishing slurry. If the content of the dispersant is 0.001% by weight or more relative to 100% by weight of the total polishing slurry, the polishing slurry can be dispersed stably and prevent precipitation. If the content of the dispersant is 0.1% by weight or less relative to 100% by weight of the total polishing slurry, it is possible to prevent the dispersion stability from being lowered due to agglomeration of the polymer dispersant or an increase in ionization concentration.

The polishing slurry may include a pH adjuster to have a suitable acidity (pH). The pH adjuster may be at least one selected from nitric acid, acetic acid, and phosphoric acid.

The polishing slurry according to an exemplary embodiment o may include a solvent. The solvent may be deionized water.

The polishing slurry according to an exemplary embodiment may have a suitable acidity (pH) depending on a workpiece. For example, the acidity (pH) of the polishing slurry in the illustrated exemplary embodiment may range from 2 to 8. If the acidity (pH) of the polishing slurry lies between 2 to 8, it is possible to polish the titanium uniformly and quickly.

The polishing pad according to an exemplary embodiment may be made of suede or polyurethane. The hardness of the polishing pad may range from 40 to 70 in Shore A scale.

The polishing process is carried out when a polishing pressure is applied to press the polishing apparatus against the substrate. According to an exemplary embodiment, the polishing pressure may range from 100 Pa to 300 Pa. If the polishing pressure is 100 Pa or more, it is possible to polish the polishing object uniformly and quickly. If the polishing pressure is 300 Pa or less, it is possible to prevent the workpiece from being polished too much or scratches on the surface of the workpiece.

The polishing process used in the method of fabricating a TFT array substrate according to an exemplary embodiment may be used to polish the second metal layer pattern of titanium exposed out of the photoresist pattern.

Hereinafter, the polishing process according to an exemplary embodiment will be described in more detail through experimental examples.

Experiment 1: Polishing Efficiency Depending on Polishing Pressure

Experimental Example 1

A grooved, suede polishing pad having the hardness of 52 in Shore A scale was prepared. A polishing slurry having the average particle diameter of 0.8 μm was prepared.

Experimental Example 2

A grooved, polyurethane polishing pad having the hardness of 67 in Shore A scale was prepared. A polishing slurry having the average particle diameter of 0.8 μm was prepared.

Figure 33:
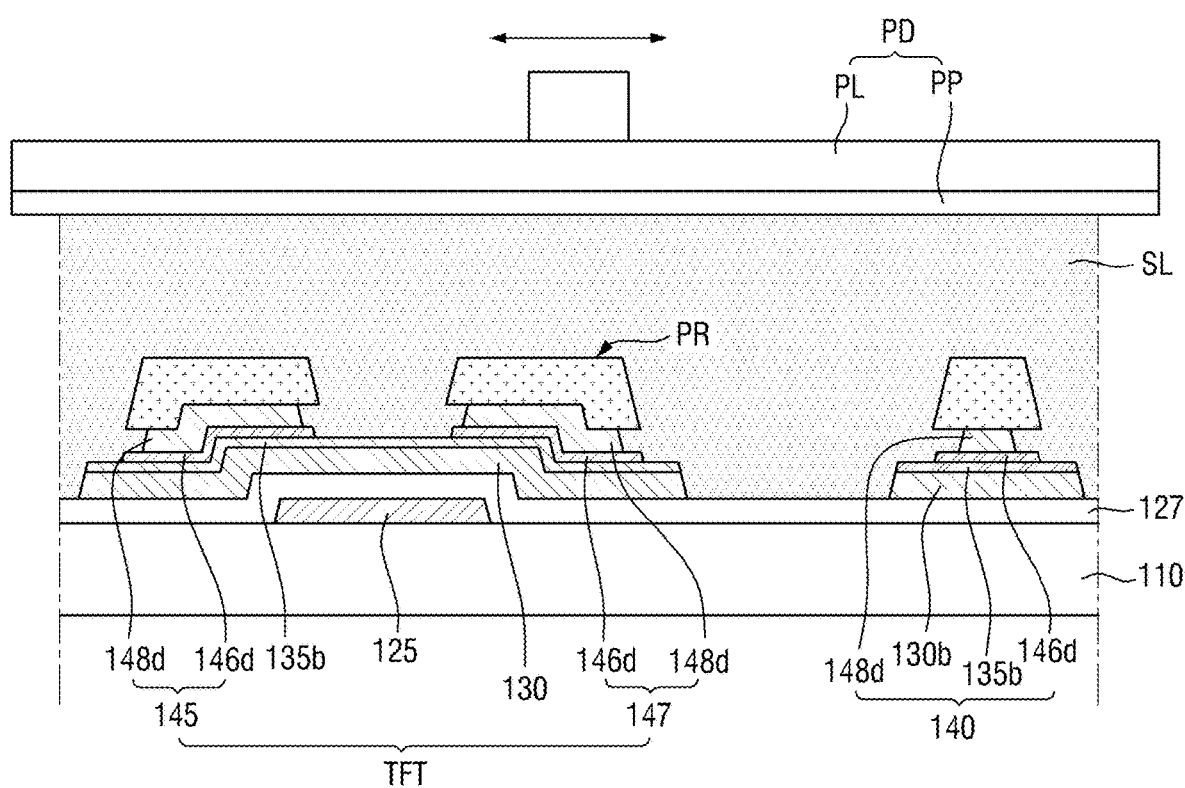
Figure 42:
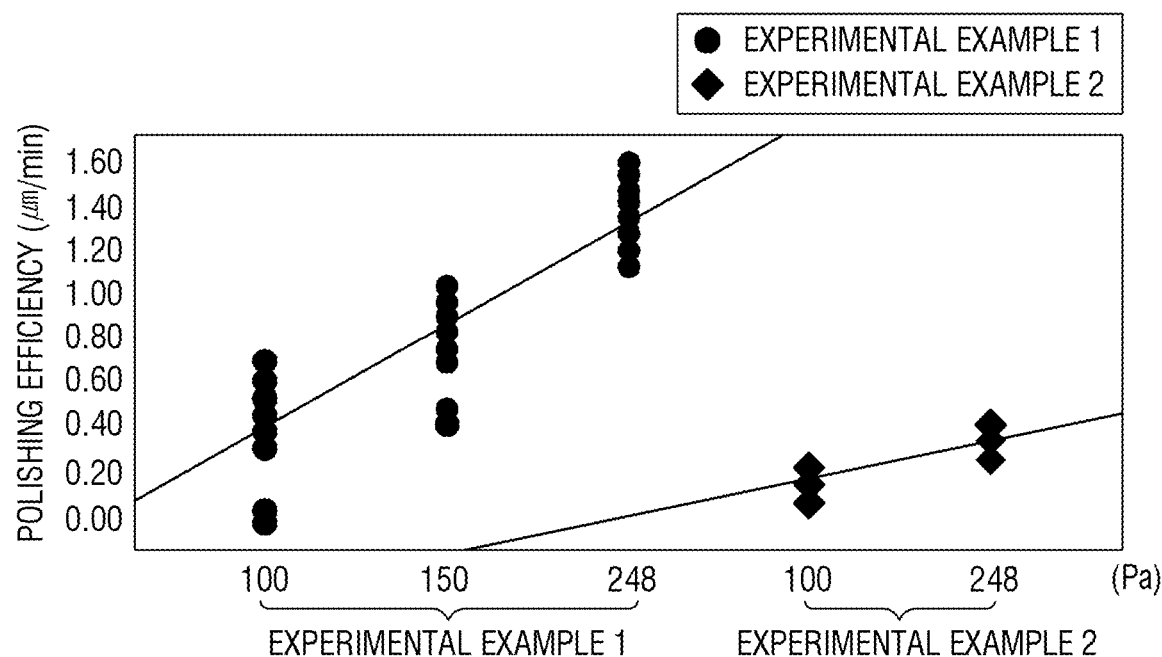
FIG. 42 is a graph showing the polishing efficiencies measured for different polishing pressures.

In the method of fabricating the TFT array substrate shown in FIG. 33, the second metal layer pattern, which is titanium, was polished under the polishing process conditions of Experimental Examples 1 and 2. FIG. 42 shows the polishing efficiencies measured for different polishing pressures. The polishing pressures were applied at 100, 150 and 248 Pa in each of Experimental Examples 1 and 2.

It can be seen from FIG. 42 that the polishing efficiency increased with the polishing pressure in both of Experimental Examples 1 and 2. In view of the above, it was found that the greater the polishing pressure in the polishing process, the higher the polishing efficiency.

Experiment 2: Polishing Efficiency Depending on Average Particle Diameter of Polishing Particles Experimental Example 3

The Experimental Example 3 is prepared in the same conditions as in Experimental Example 1, except that polishing slurries having the average particle diameters of 0.8 μm, 1.3 μm and 2.8 μm were prepared.

Experimental Example 4

The Experimental Example 4 is prepared in the same conditions as in Experimental Example 2, except that polishing slurries having the average particle diameters of 0.8 μm, and 2.8 μm were prepared.

Figure 43:
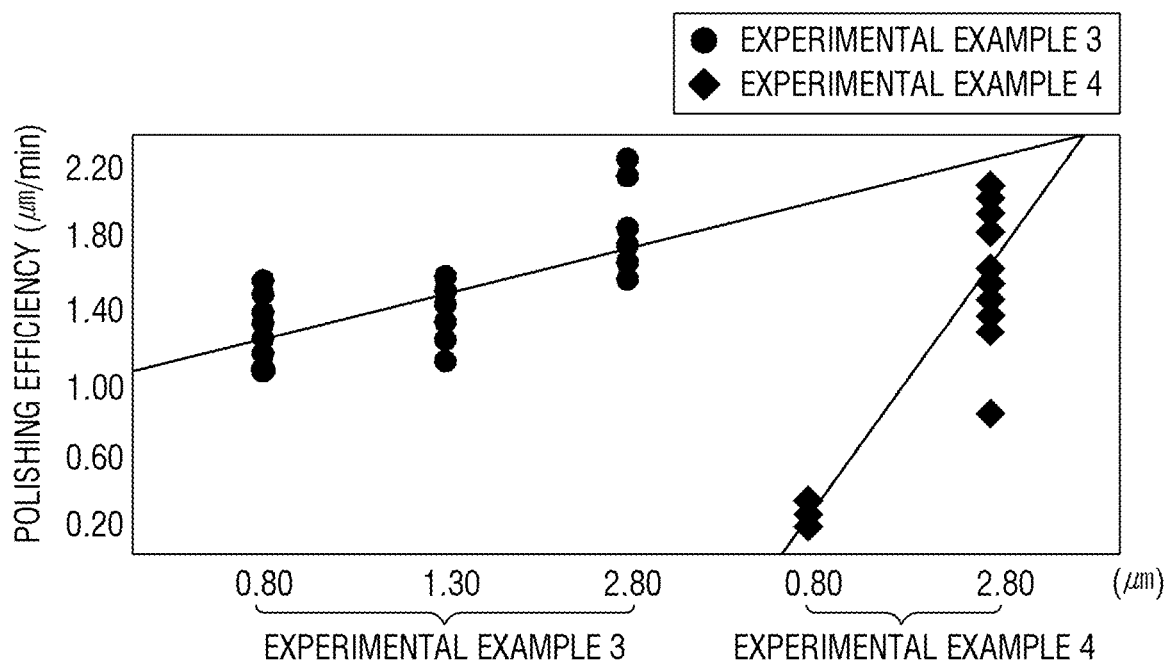
FIG. 43 is a graph showing the polishing efficiencies measured for different average particles diameter of polishing particles.

In the method of fabricating the TFT array substrate shown in FIG. 33, the second metal layer pattern, which is titanium, was polished under the polishing process conditions of Experimental Examples 3 and 4. FIG. 43 shows the polishing efficiencies for different average particle diameters of the polishing particles. The polishing pressure at 248 Pa was equally applied.

It can be seen from FIG. 43 that the polishing efficiency increased with the average particles diameter in both of Experimental Examples 3 and 4. In view of the above, it was found that the greater the average particles diameter in the polishing process, the higher the polishing efficiency.

Experiment 3: Polishing Efficiency Depending on Polishing Pad

Experimental Example 5

The polishing process was prepared under the same conditions as Experimental Example 1.

Experimental Example 6

The polishing process was prepared under the same conditions as Experimental Example 2, except that the polishing pad having the hardness of 55 in Shore A scale was prepared.

Experimental Example 7

The polishing process was prepared under the same conditions as Experimental Example 2.

Figure 44:
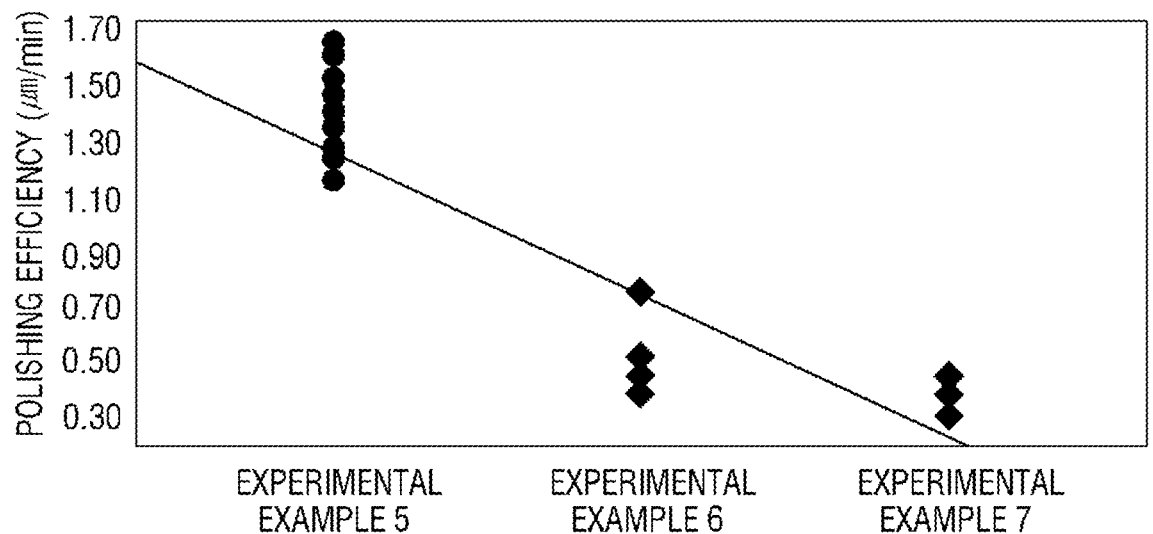
FIG. 44 is a graph showing the polishing efficiencies measured for different polishing pads.

In the method of fabricating the TFT array substrate shown in FIG. 33, the second metal layer pattern, which is titanium, was polished under the polishing process conditions of Experimental Examples 5 to 7. FIG. 44 shows the polishing efficiencies measured for different polishing pads. The polishing pressure at 248 Pa was equally applied.

It can be seen from FIG. 44 that the suede polishing pad used in Experimental Example 5 exhibited higher polishing efficiency than the polyurethane polishing pads used in Experimental Examples 6 and 7. In view of the above, it was found that a suede polishing pad has a higher polishing efficiency than a polyurethane polishing pad during a polishing process.

Experiment 4: Polishing Efficiency Depending on Polishing Process Conditions

Figure 45:
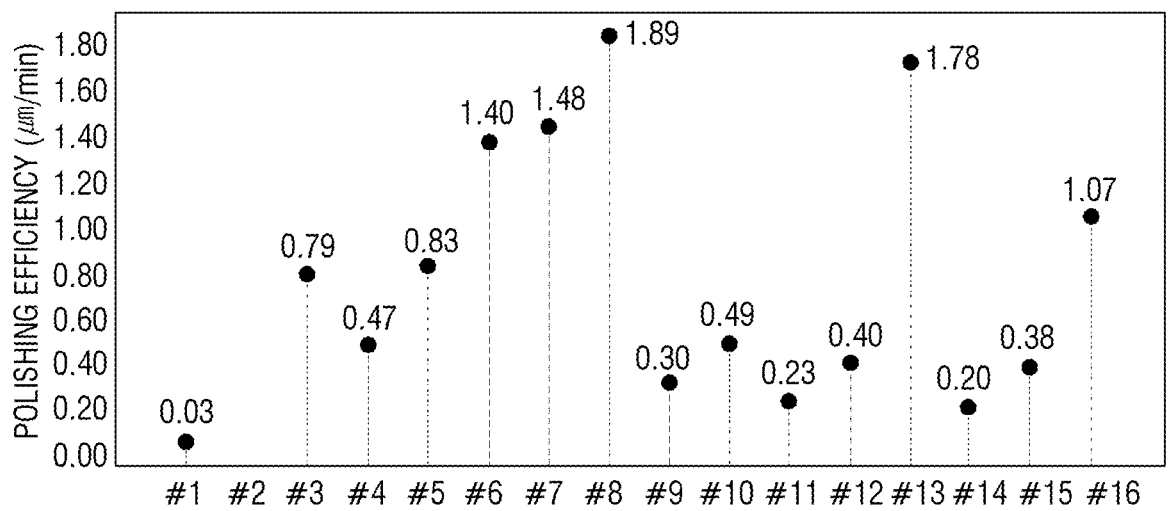
FIG. 45 is a graph showing the polishing efficiencies for different polishing process conditions.

Polishing efficiencies for different polishing process conditions (type of polishing pad, hardness of polishing pad, average particle diameter of polishing particles, polishing pressure, groove presence) were measured, and shown in Table 1 and FIG. 45.

Figure 46:
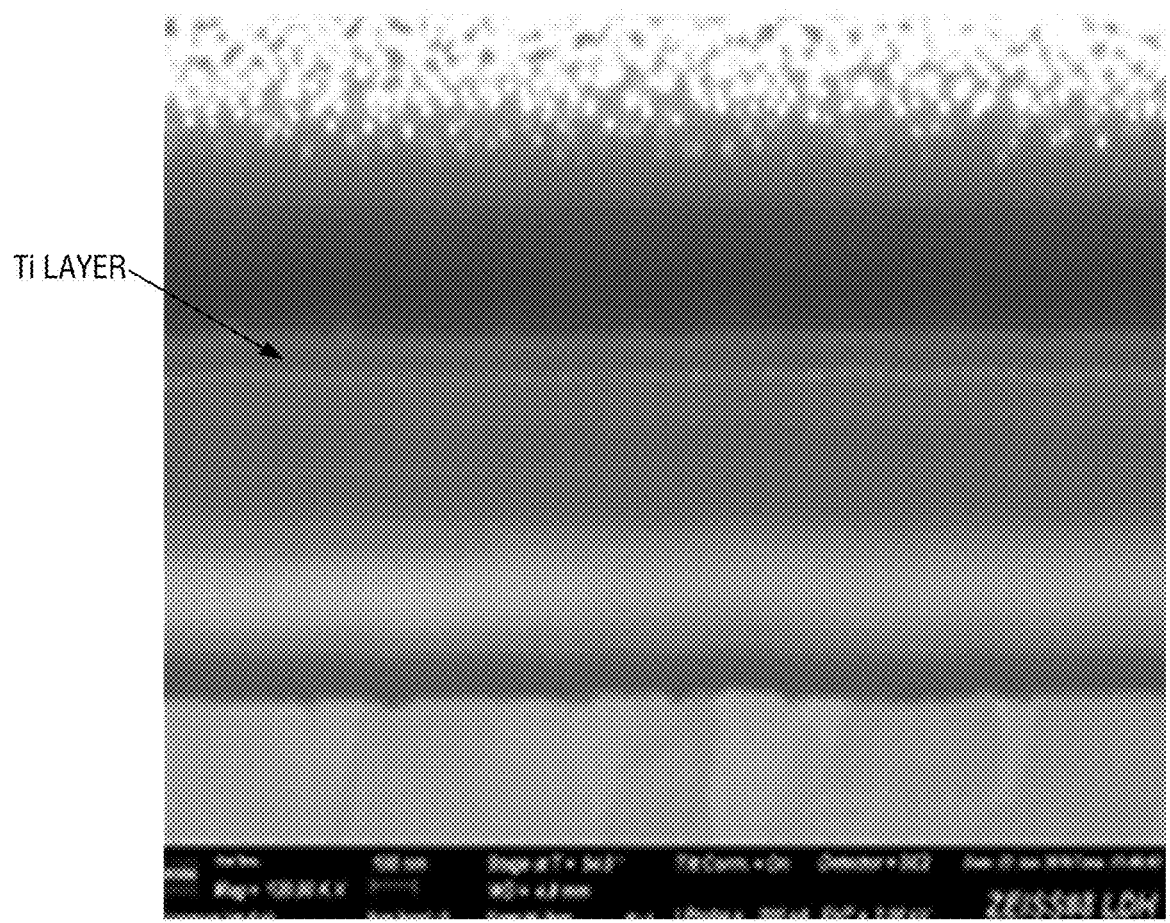
FIGS. 46 and 47 are SEM images of a thin-film transistor fabricated according to Experimental Example 8.
Figure 47:
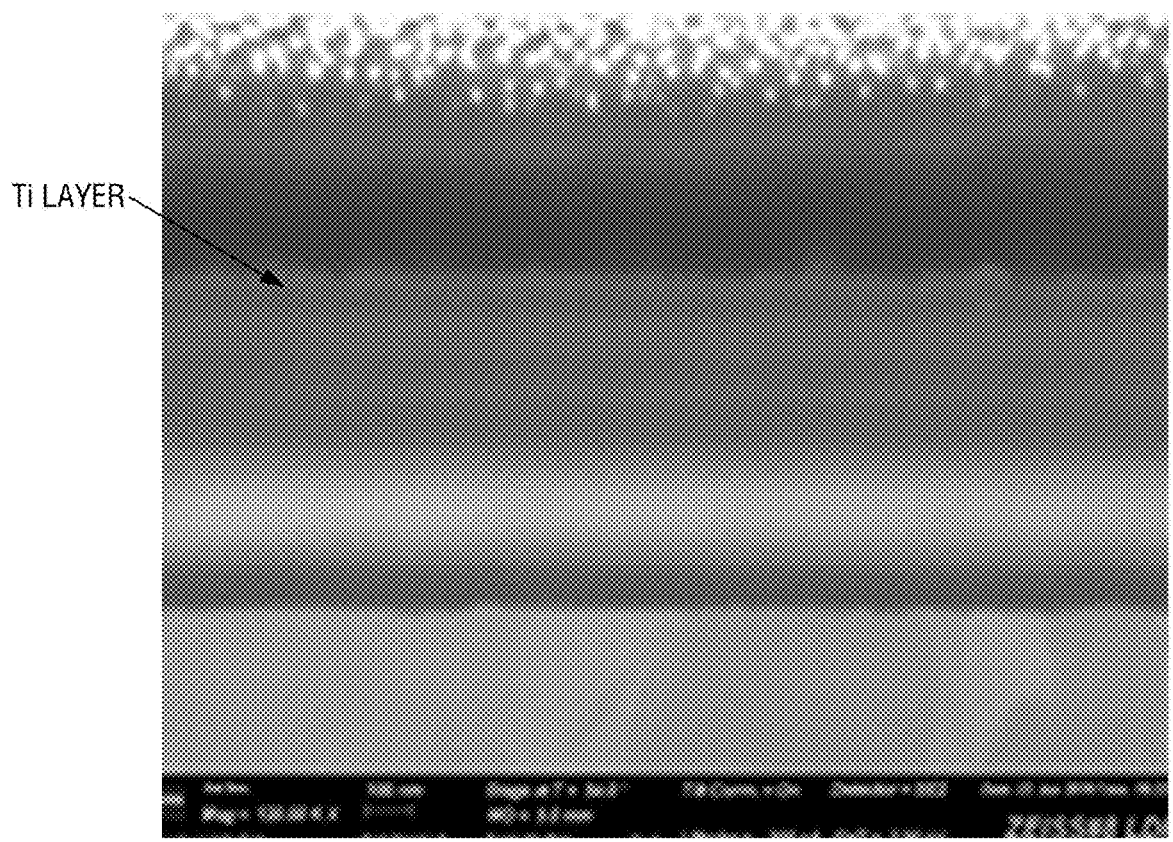
Figure 48:
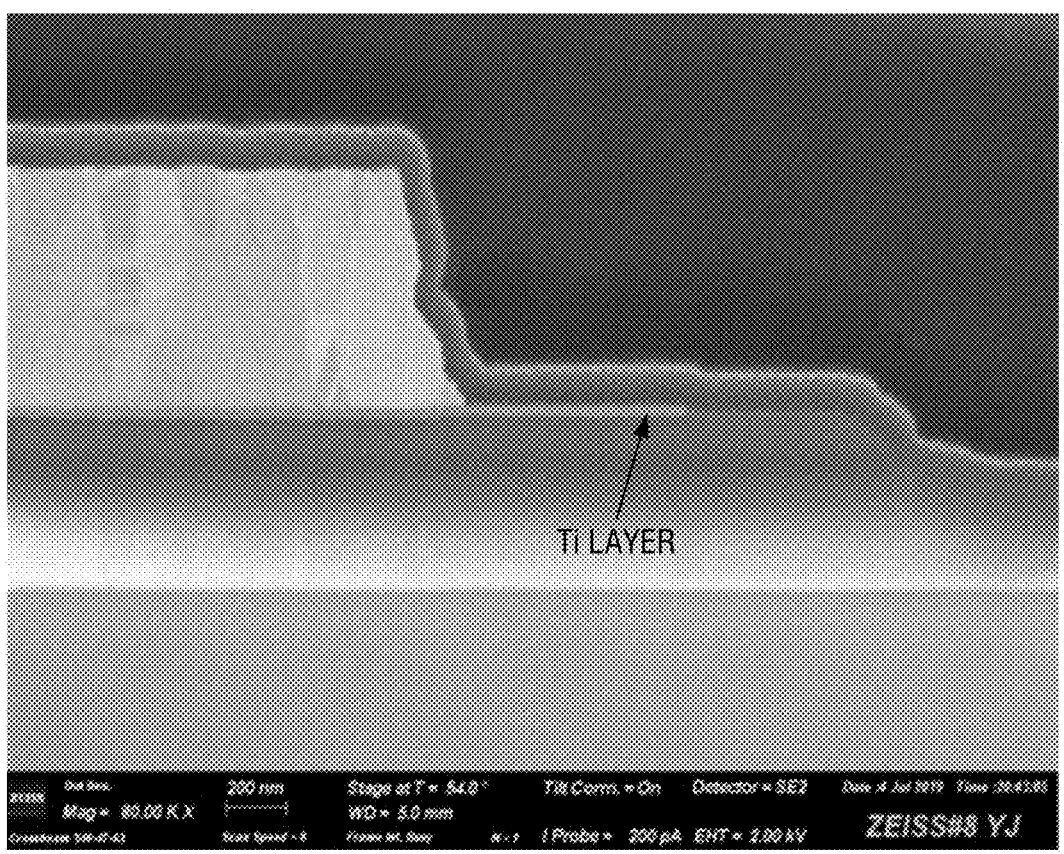
FIGS. 48 and 49 are SEM images of a thin-film transistor fabricated according to Experimental Example 9.
Figure 49:
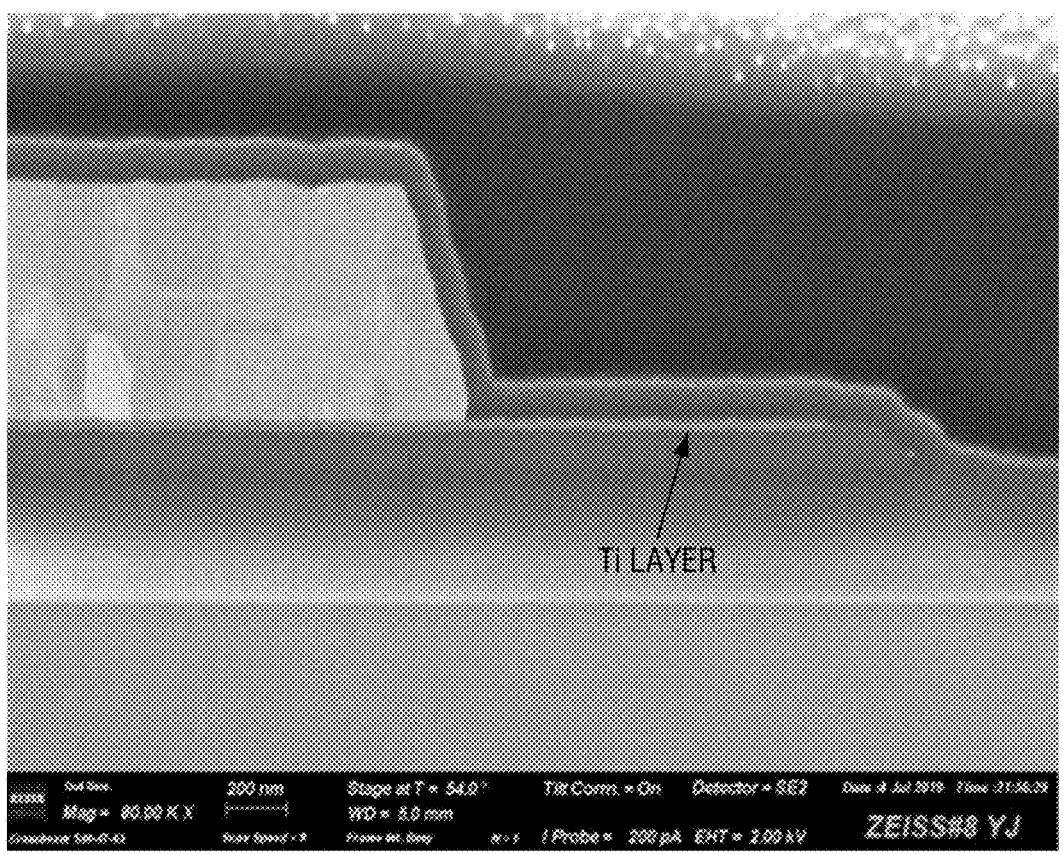

SEM images of the thin-film transistors fabricated according to Experimental Example 8 are shown in FIGS. 46 and 47, and SEM images of the thin-film transistors manufactured according to Experimental Example 9 are shown in FIGS. 48 and 49.

As shown in FIGS. 46 and 47, in Experimental Example 8, only a portion of the titanium thin film was polished, and accordingly, it was partially etched or not etched. In contrast, as shown in FIGS. 48 and 49, in Experimental Example 9, the titanium thin film was polished and patterned.

As described above, in a method of fabricating a TFT array substrate according to an exemplary embodiment, a second metal layer pattern of a source electrode/drain electrode is etched via a polishing process, and thus, as compared to a dry etching process, it is possible to prevent leakage current from being generated by $CuCl_2$.

In addition, in a method of fabricating a TFT array substrate according to an exemplary embodiment, a second metal layer pattern of a source electrode/drain electrode is etched via a polishing process, and thus, as compared to a wet etching process, it is possible to reduce Mura in images.

TABLE 1

| | Groove | Hardness in Shore A Scale | Kind of Polishing Pad | Polishing Pressure (Pa) | Average Diameter of Polishing Particles (μm) | Polishing Efficiency (μm/min) |
|---|---|---|---|---|---|---|
| #1 | Yes | 28 | Suede | 150 | 0.25 | 0.03 |
| #2 | | | | | 0.80 | 0.64 |
| #3 | | | | | 1.30 | 0.79 |
| #4 | | 52 | | 100 | 0.80 | 0.47 |
| #5 | | | | 150 | | 0.83 |
| #6 | | | | 248 | | 1.40 |
| #7 | | | | 248 | 1.30 | 1.48 |
| #8 | | | | 248 | 2.80 | 1.89 |
| #9 | | 55 | Poylurethan | 150 | 0.80 | 0.30 |
| #10 | | | | 248 | | 0.49 |
| #11 | | 67 | | 100 | | 0.23 |
| #12 | | | | 248 | | 0.40 |
| #13 | | | | 248 | 2.80 | 1.78 |
| #14 | No | 67 | | 100 | 0.80 | 0.20 |
| #15 | | | | 248 | | 0.38 |
| #16 | | | | 248 | 2.80 | 1.07 |

It can be seen from Table 1 and FIG. 45 that the polishing efficiency is higher if the hardness of the polishing pad is lower, if the polishing efficiency is higher, if the average particle diameter of the polishing particles is larger, and if the polishing pad is made of suede compared to polyurethane.

Experiment 5: Fabrication of Thin-Film Transistor According to Polishing Efficiency Experimental Example 8

Using the suede polishing pad and silica polishing particles, the TFT array substrate according to the above-described exemplary embodiment was fabricated twice under polishing process conditions with a polishing efficiency of less than 0.2 nm/min.

Experimental Example 9

Using the polyurethane polishing pad and silica polishing particles, the TFT array substrate according to the above-described exemplary embodiment was fabricated twice under polishing process conditions with the polishing efficiency of 0.3 nm/min.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of fabricating a thin-film transistor (TFT) array substrate, the method comprising:
    forming a gate electrode on a substrate;
    forming a gate insulating layer on the gate electrode;
    forming a semiconductor layer on the gate insulating layer;
    forming an ohmic contact layer on the semiconductor layer; and
    forming a source electrode and a drain electrode comprising a plurality of metal layer patterns on the ohmic contact layer,
    wherein the semiconductor layer, the ohmic contact layer, the source electrode, and the drain electrode are formed through a single mask process, and wherein one of the plurality of metal layer patterns is etched through a polishing process to form the source electrode and the drain electrode.

2. The method of claim 1, wherein the gate electrode is formed using a first mask.

3. The method of claim 1, wherein forming the semiconductor layer, the source electrode, and the drain electrode comprises:
stacking a first amorphous silicon layer, a second amorphous silicon layer, a second metal layer, and a third metal layer on the substrate;
forming a photoresist pattern on the third metal layer using a second mask; and
etching the first amorphous silicon layer, the second amorphous silicon layer, the second metal layer, and the third metal layer to form the semiconductor layer, the ohmic contact layer, the source electrode, and the drain electrode.

4. The method of claim 3, wherein the second mask includes a transmissive region through which light is transmitted, a non-transmissive region through which light is blocked, and a transflective region through which an amount of transmitted light is adjusted.

5. The method of claim 4, wherein the photoresist pattern includes a first photoresist region in line with the non-transmissive region and a second photoresist region in line with the transflective region.

6. The method of claim 5, wherein a thickness of the second photoresist region is less than a thickness of the first photoresist region.

7. The method of claim 6, wherein forming the source electrode and the drain electrode comprises:
wet etching the second metal layer and the third metal layer by using the photoresist pattern as a mask to form a second metal layer pattern and a third metal layer pattern;
ashing the photoresist pattern to remove the second photoresist region and reduce the thickness of the first photoresist region to form a third photoresist region;
wet etching the third metal layer pattern not overlapping with the third photoresist region to form a fourth metal layer pattern; and
etching the second metal layer pattern not overlapping with the third photoresist region via a polishing process to form a fifth metal layer pattern, such that the source electrode and the drain electrode including the fourth metal layer pattern and the fifth metal layer pattern stacked one over another are formed.

8. The method of claim 7, further comprising, prior to ashing the photoresist pattern, simultaneously dry etching the first amorphous silicon layer and the second amorphous silicon layer using the photoresist pattern as a mask to form the first amorphous silicon layer as a semiconductor pattern and the second amorphous silicon layer as an ohmic pattern.

9. The method of claim 8, wherein after forming the source electrode and the drain electrode, the ohmic pattern and the semiconductor pattern may be dry etched using the photoresist pattern as a mask to form the ohmic contact layer and the semiconductor layer.

10. The method of claim 1, further comprising, after forming the source electrode and the drain electrode, forming a passivation layer over the substrate and forming a via hole exposing the drain electrode using a third mask; and
forming a pixel electrode on the passivation layer by using a fourth mask.

11. The method of claim 1, wherein the polishing process comprises applying a polishing slurry onto the substrate and polishing one of the plurality of metal layer patterns using a polishing apparatus including a polishing pad.

12. The method of claim 11, wherein the polishing slurry includes polishing particles, and an average particle diameter of the polishing particles is in a range from 0.1 μm to 5 μm.

13. The method of claim 11, wherein an acidity (pH) of the polishing slurry is in a range from 2 to 8.

14. The method of claim 11, wherein the polishing pad includes suede or polyurethane.

15. The method of claim 11, wherein the polishing apparatus applies a polishing pressure to press the substrate, and a polishing pressure is in a range from 100 Pa to 300 Pa.

16. A method of fabricating a thin-film transistor (TFT) array substrate, the method comprising:
forming a gate electrode on a substrate;
forming a gate insulating layer on the gate electrode;
forming a semiconductor layer on the gate insulating layer;
forming an ohmic contact layer on the semiconductor layer; and
forming a source electrode and a drain electrode on the ohmic contact layer by etching through a polishing process,
wherein the polishing process comprises applying a polishing slurry onto the substrate and etching the source electrode and the drain electrode by using a polishing apparatus including a polishing pad.

17. The method of claim 16, wherein the polishing slurry has a negative zeta potential, and the source and drain electrodes have a positive zeta potential at a same pH value.

18. The method of claim 16, wherein the polishing slurry includes polishing particles, and an average particle diameter of the polishing particles is in a range from 0.1 μm to 5 μm.

19. The method of claim 16, wherein an acidity (pH) of the polishing slurry is in a range from 2 to 8.

20. The method of claim 16, wherein the polishing apparatus applies a polishing pressure to press the substrate, and a polishing pressure is in a range from 100 Pa to 300 Pa.

* * * * *